(12) United States Patent
Sasaki et al.

(10) Patent No.: US 8,796,078 B2
(45) Date of Patent: Aug. 5, 2014

(54) SEMICONDUCTOR DEVICE AND MANUFACTURING METHOD THEREOF

(75) Inventors: Toshinari Sasaki, Atsugi (JP); Hiroki Ohara, Sagamihara (JP); Junichiro Sakata, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 417 days.

(21) Appl. No.: 12/787,757

(22) Filed: May 26, 2010

(65) Prior Publication Data
US 2010/0304529 A1    Dec. 2, 2010

(30) Foreign Application Priority Data
May 29, 2009 (JP) .................. 2009-131187

(51) Int. Cl.
*H01L 21/336* (2006.01)
*H01L 21/786* (2006.01)

(52) U.S. Cl.
USPC ..... 438/158; 438/786; 438/787; 257/E21.414

(58) Field of Classification Search
USPC ......... 438/151, 158, 159, 161, 786, 787, 104; 257/E21.414
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,847,410 A | 12/1998 | Nakajima |
| 6,294,274 B1 | 9/2001 | Kawazoe et al. |
| 6,563,174 B2 | 5/2003 | Kawasaki et al. |
| 6,586,346 B1 | 7/2003 | Yamazaki et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

(Continued)

*Primary Examiner* — Zandra Smith
*Assistant Examiner* — Toniae Thomas
(74) *Attorney, Agent, or Firm* — Eric J. Robinson; Robinson Intellectual Property Law Office, P.C.

(57) ABSTRACT

An object is to provide a highly reliable semiconductor device including a thin film transistor having stable electric characteristics. In addition, another object is to manufacture a highly reliable semiconductor device at low cost with high productivity. In a method for manufacturing a semiconductor device including a thin film transistor including an oxide semiconductor layer as a channel formation region, the oxide semiconductor layer is heated under a nitrogen atmosphere to lower its resistance, thereby forming a low-resistance oxide semiconductor layer. Further, resistance of a region of the low-resistance oxide semiconductor layer, which is overlapped with a gate electrode layer, is selectively increased, thereby forming a high-resistance oxide semiconductor layer. Resistance of the oxide semiconductor layer is increased by forming a silicon oxide film in contact with the oxide semiconductor layer by a sputtering method.

24 Claims, 28 Drawing Sheets

(56) References Cited

U.S. PATENT DOCUMENTS

| | | | |
|---|---|---|---|
| 6,727,522 B1 | 4/2004 | Kawasaki et al. |
| 6,960,812 B2 | 11/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,855,379 B2 | 12/2010 | Hayashi et al. |
| 8,088,652 B2 | 1/2012 | Hayashi et al. |
| 8,193,045 B2 | 6/2012 | Omura et al. |
| 8,436,349 B2 | 5/2013 | Sano et al. |
| 8,566,502 B2 | 10/2013 | Vaghani |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0241327 A1 | 10/2007 | Kim et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0299702 A1 | 12/2008 | Son et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2008/0315193 A1 | 12/2008 | Kim et al. |
| 2008/0318368 A1 | 12/2008 | Ryu et al. |
| 2009/0008639 A1 | 1/2009 | Akimoto et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0186437 A1 | 7/2009 | Akimoto |
| 2009/0186445 A1 | 7/2009 | Akimoto |
| 2009/0189155 A1 | 7/2009 | Akimoto |
| 2009/0189156 A1 | 7/2009 | Akimoto |
| 2009/0278122 A1 | 11/2009 | Hosono et al. |
| 2009/0280600 A1 | 11/2009 | Hosono et al. |
| 2010/0003783 A1 | 1/2010 | Akimoto |
| 2010/0025678 A1 | 2/2010 | Yamazaki et al. |
| 2010/0038639 A1 | 2/2010 | Akimoto |
| 2010/0065837 A1 | 3/2010 | Omura et al. |
| 2010/0065845 A1 | 3/2010 | Nakayama |
| 2010/0127257 A1 | 5/2010 | Ryu et al. |
| 2010/0252827 A1* | 10/2010 | Asano et al. ............ 438/104 |
| 2010/0252832 A1* | 10/2010 | Asano et al. ............ 438/158 |
| 2012/0295399 A1 | 11/2012 | Kim et al. |

FOREIGN PATENT DOCUMENTS

| | | |
|---|---|---|
| JP | 60-198861 | 10/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 | 10/1991 |
| JP | 05-251705 | 9/1993 |
| JP | 08-264794 | 10/1996 |
| JP | 08-264794 A | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-086000 | 3/2003 |
| JP | 2003-086000 A | 3/2003 |
| JP | 2003-086808 | 3/2003 |
| JP | 2004-103957 | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| JP | 2007-250983 | 9/2007 |
| JP | 2008-235871 A | 10/2008 |
| JP | 2009-004787 A | 1/2009 |
| JP | 2009-010362 A | 1/2009 |

(56) References Cited

FOREIGN PATENT DOCUMENTS

| JP | 2009-031742 A | 2/2009 |
|---|---|---|
| WO | WO 2004/114391 | 12/2004 |
| WO | WO 2007/119386 | 10/2007 |
| WO | WO-2008/105347 | 9/2008 |
| WO | WO-2008/126878 | 10/2008 |
| WO | WO-2008/149873 | 12/2008 |

OTHER PUBLICATIONS

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Takahashi et al., "Theoretical Analysis of IGZO Transparent Amorphous Oxide Semiconductor," IDW '08: Proceedings of the 15$^{th}$ International Display Workshops, Dec. 3, 2008, pp. 1637-1640.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$—$Ga_2ZnO_4$—Zno System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)_m$ (m = 3, 4, and 5), $InGaO_3(ZnO)_3$, and $Ga_2O_3(ZnO)_m$ (m = 7, 8, 9, and 16) in the $In_2O_3$—$ZnGa_2O_4$—ZnO System," Journal of Solid State Chemistry, Apr. 1, 1995, vol. 116, No. 1, pp. 170-178.

Nakamura et al., "Syntheses and crystal structures of new homologous compounds, indium iron zinc oxides ($InFeO_3(ZnO)m$) (m: natural number) and related compounds," Kotai Butsuri (Solid State Physics), 1993, vol. 28, No. 5, pp. 317-327.

Nomura et al., "Thin-Film Transistor Fabricated in Single-Crystalline Transparent Oxide Semiconductor," Science, May 23, 2003, vol. 300, No. 5623, pp. 1269-1272.

Osada et al., "15.2: Development of Driver-Integrated Panel using Amorphous In—Ga—Oxide TFT," SID Digest '09: SID International Symposium Digest of Technical Papers, May 31, 2009, pp. 184-187.

Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Lee et al., "World's Largest (15-Inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, pp. 899-902.

Kanno et al., "White Stacked Electrophosphorecent Organic Light-Emitting Device Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the 9$^{th}$ International Display Workshops, Dec. 4, 2002, pp. 295-298.

Jeong et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUS on Flexible and Glass Substrates for Secure RFID Systems," Journal of Solid-State Circuits, 2008, vol. 43, No. 1, pp. 292-299.

Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: The "Blue Phase"," Physics Letters, Sep. 10, 1973, vol. 45A, No. 2 pp. 115-116.

Cho et al., "21.2: Al and Sn-Doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium—Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display With Driver Circuit Using Amorphous In—Ga—Zn—Oxide TFTs," IDW '09: Proceedings of the 16$^{th}$ International Display Workshops, 2009, pp. 689-692.

Park et al., "Amorphous Indium—Gallium—Zinc Oxide TFTs and Their Application for Large Size AMOLED," AM-FPD '08 Digest of Technical Papers, Jul. 2, 2008, pp. 275-277.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Osada et al., "Development of Driver-Integrated Panel Using Amorphous In—Ga—Zn—-Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9 Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

Ohara et al., "21.3 4.0 In. QVGA AMOLED Display Using In—Ga—Zn—Oxide TFTs with a Novel Passivation Layer," SID Digest '09: SID International Symposium Digest of Technical Papers, May 31, 2009, pp. 284-287.

Miyasaka, "Suftla Flexible Microelectronics on Their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1 Polarizer-Free Reflective LCD Combined With Ultra Low-Power Driving Technology," SID Digest '09: SID International Symposium Digest of Technical Papers, 2009, pp. 395-398.

Lee et al., "Current Status of, Challenges to, and Perspective View of AM-OLED," IDW '06: Proceedings of the 13$^{th}$ International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi et al., "Polymer-Stabilized Liquid Crystal Blue Phases," Nature Materials, Sep. 1, 2002, vol. 1, pp. 64-68.

(56) References Cited

OTHER PUBLICATIONS

Kimizuka et al., "Spinel, $YbFe_2O_4$, and $Yb_2Fe_3O_7$ Types of Structures for Compounds in the $In_2O_3$ and $Sc_2O_3$—$A_2O_3$-BO Systems [A: Fe, Ga, or Al; B: Mg, Mn, Fe, Ni, Cu, or Zn] at Temperatures Over 1000° C.," Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and Its Blue Phase," Phys. Rev. A (Physical Review. A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

European Search Report (Application No. 10162610.9) dated Oct. 5, 2010.

Fortunato.E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Hayashi.R et al., "42.1: Invited Paper: Improved Amorphorous In—Ga—Zn—O TFTs,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline $InGaO_3$(ZnO)5 films,", Appl. Phys. Lett. (Applied Physics Letters), Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest'08: SID International Symposium Digest of Technical Papers, May 20, 2008, vol. 39, pp. 633-636.

Van De Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Nakamura, "Synthesis of Homologous Compound with New long-Period Structure,", NIRIM Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent $InGaZnO4$,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide $InGaO_3$(ZnO)m (m<4): a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on $SrTiO3$ With Sputtered $Al2O3$ Gate Insulator,", Appl. Phys. Lett. (Applied Physics Letters), Sep. 1, 2003, vol. 83, No. 9, pp. 1755-1757.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

* cited by examiner

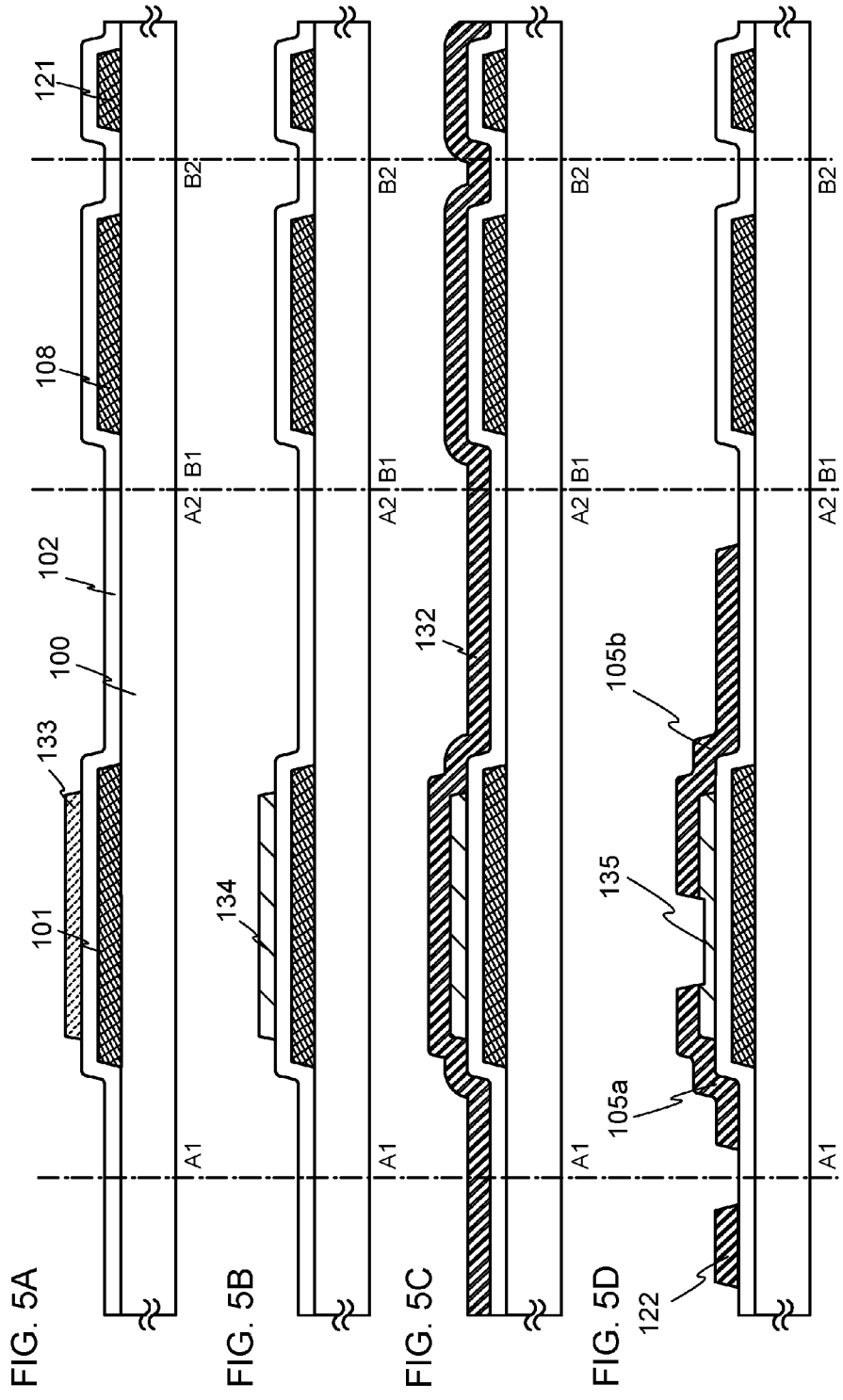

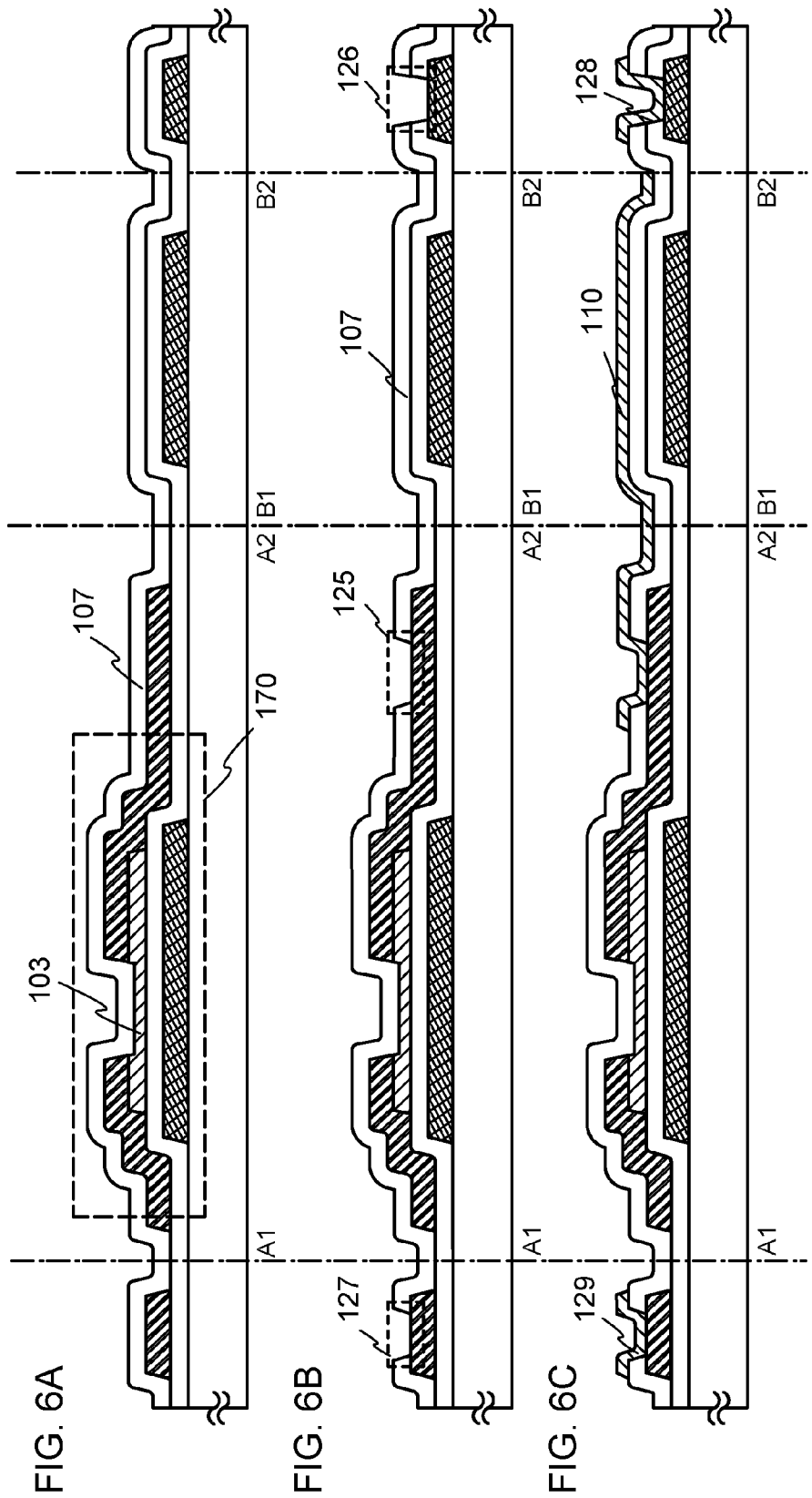

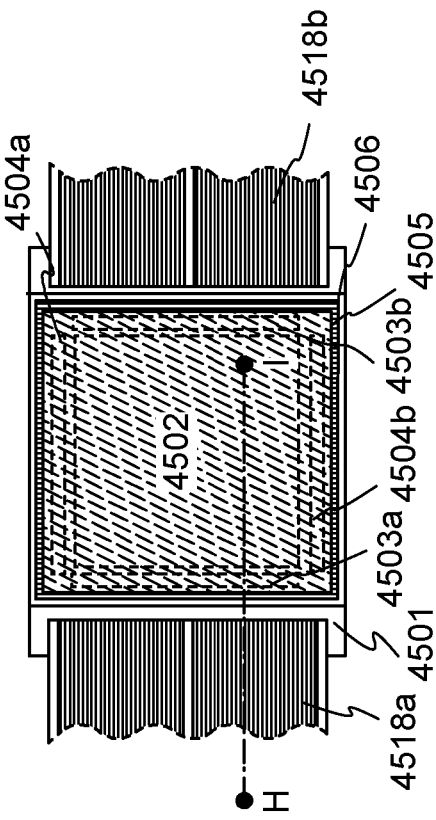
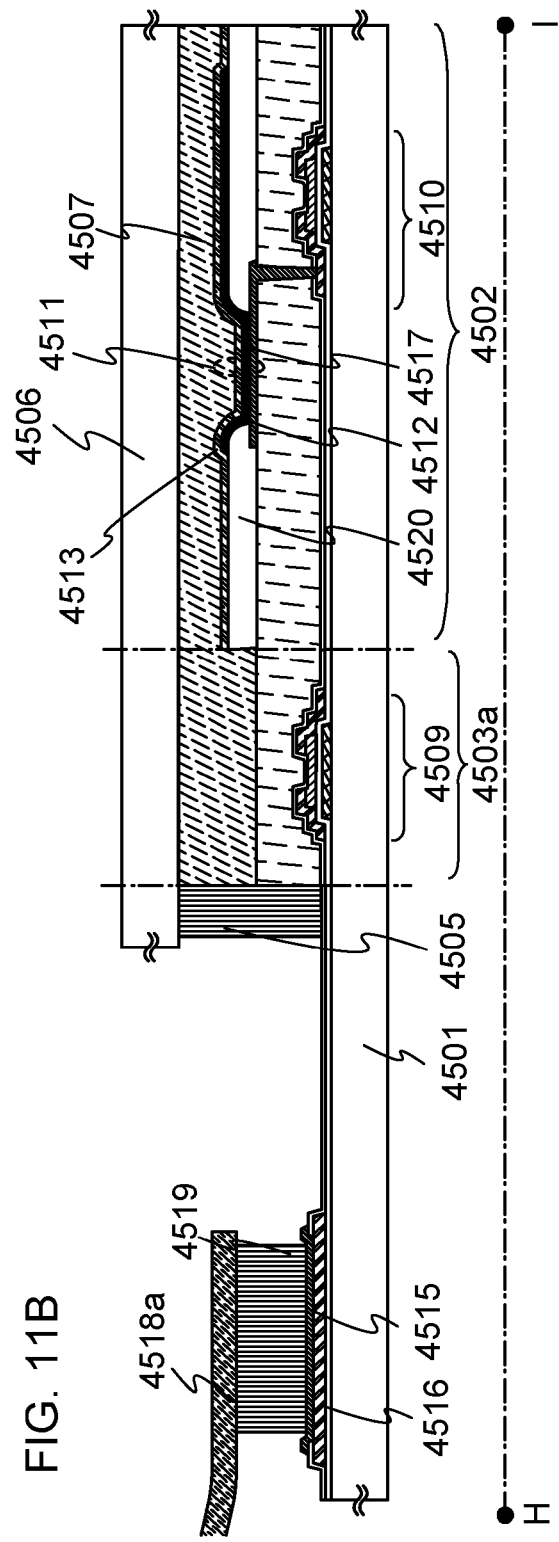
FIG. 11A
FIG. 11B

SEMICONDUCTOR DEVICE AND MANUFACTURING METHOD THEREOF

BACKGROUND OF THE INVENTION

1. Field of the Invention

The present invention relates to a semiconductor device including an oxide semiconductor and a manufacturing method thereof 2. Description of the Related Art Various metal oxides are used for a variety of applications. Indium oxide is a well-known material and is used as a transparent electrode material which is necessary for liquid crystal displays and the like.

Some metal oxides exhibit semiconductor characteristics. For example, metal oxides exhibiting semiconductor characteristics include tungsten oxide, tin oxide, indium oxide, zinc oxide, and the like, and thin film transistors in which a channel formation region is formed using such a metal oxide exhibiting semiconductor characteristics have already been known (see Patent Documents 1 to 4 and Non-Patent Document 1).

Further, not only single-component oxides but also multi-component oxides are known as metal oxides. For example, $InGaO_3(ZnO)_m$ (m: natural number) belonging to homologous series has been known as a multi-component oxide semiconductor including In, Ga, and Zn (see Non-Patent Documents 2 to 4).

Further, it is proved that an oxide semiconductor formed using an In—Ga—Zn based oxide as described above can be used for a channel layer of a thin film transistor (see Patent Document 5 and Non-Patent Documents 5 and 6).

REFERENCE

Patent Document

[Patent Document 1] Japanese Published Patent Application No. S60-198861

[Patent Document 2] Japanese Published Patent Application No. H8-264794

[Patent Document 3] Japanese Translation of PCT International Application No. H11-505377

[Patent Document 4] Japanese Published Patent Application No. 2000-150900

[Patent Document 5] Japanese Published Patent Application No. 2004-103957

Non-Patent Document

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68, pp. 3650-3652

[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315

[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)$. (m=7, 8, 9, and 16) in the $In_2O_3$—$ZnGa_2O_4$—ZnO System", *J. Solid State Chem.*, 1995, Vol. 116, pp. 170-178

[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_m$) (m: natural number) and related compounds", *KOTAI BUTSURI (SOLID STATE PHYSICS)*, 1993, Vol. 28, No. 5, pp. 317-327

[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272

[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432, pp. 488-492

SUMMARY OF THE INVENTION

An object is to provide a highly reliable semiconductor device including a thin film transistor with stable electric characteristics.

In a method for manufacturing a semiconductor device which includes a thin film transistor in which a semiconductor layer including a channel formation region is formed using an oxide semiconductor layer, heat treatment is performed under a nitrogen atmosphere after formation of the oxide semiconductor layer and then a silicon oxide film is formed by a sputtering method so as to be in contact with a region which is in the oxide semiconductor layer subjected to heat treatment and overlapped with a gate electrode layer.

Resistance of the oxide semiconductor layer is reduced by heat treatment performed under a nitrogen atmosphere (that is, increase in electrical conductivity, with preferable electrical conductivity of $1\times10^{-1}$ S/cm to $1\times10^2$ S/cm, inclusive); thus, a low-resistance oxide semiconductor layer can be formed. Further, when a silicon oxide film is formed by a sputtering method so as to be in contact with the low-resistance oxide semiconductor layer, in the low-resistance oxide semiconductor layer, resistance of at least a region which is in contact with the silicon oxide film can be increased (decrease in electrical conductivity); thus, a high-resistance oxide semiconductor region can be formed.

In this specification, an oxide semiconductor layer just formed as a layer is also referred to as a first oxide semiconductor layer. After the first oxide semiconductor layer is heated under a nitrogen atmosphere to reduce its resistance, the oxide semiconductor layer is also referred to as a second oxide semiconductor layer. By formation of a silicon oxide film in contact with the second oxide semiconductor layer by a sputtering method, a region of the second oxide semiconductor layer in contact with the silicon oxide layer has resistance higher than the second oxide semiconductor layer; the thus formed high-resistance oxide semiconductor layer is also referred to as a third oxide semiconductor layer. In this specification, resistance of the second oxide semiconductor layer is lower than that of the first oxide semiconductor layer, and resistance of the high-resistance region in the third oxide semiconductor layer is higher than that of the second oxide semiconductor layer. Note that the first oxide semiconductor layer may have resistance higher or lower than the high-resistance third oxide semiconductor layer (either case is possible).

When the high-resistance oxide semiconductor region is used as a channel formation region, electric characteristics of a thin film transistor can be stabilized and increase in off current or the like can be prevented.

Heat treatment of the oxide semiconductor layer under a nitrogen atmosphere is preferably performed at a temperature of 200° C. or higher. The heat treatment of the oxide semiconductor layer under a nitrogen atmosphere may be performed after formation of a source electrode layer and a drain electrode layer.

Further, the oxide semiconductor layer can be formed by a sputtering method under a rare gas (typically argon) atmosphere, an oxygen atmosphere, or an atmosphere containing a rare gas (typically argon) and oxygen.

The silicon oxide film also functions as a protective insulating layer of a thin film transistor. The silicon oxide film can be formed by a sputtering method under a rare gas (typically argon) atmosphere, an oxygen atmosphere, or an atmosphere containing a rare gas (typically argon) and oxygen.

After formation of the silicon oxide film functioning as a protective insulating layer, the thin film transistor may be subjected to heat treatment (preferably at a temperature of 300° C. or lower) under a nitrogen atmosphere or an air atmosphere (in the air). The heat treatment can reduce variation in electric characteristics of a thin film transistor.

Accordingly, a semiconductor device including a highly reliable thin film transistor having favorable electric characteristics can be provided.

As the oxide semiconductor layer, an oxide material having semiconductor characteristics may be used. For example, an oxide semiconductor having a structure expressed by $InMO_3(ZnO)_m$ (m>0) can be used, and an In—Ga—Zn—O based oxide semiconductor is particularly preferably used. Note that M denotes one or more of metal elements selected from gallium (Ga), iron (Fe), nickel (Ni), manganese (Mn), and cobalt (Co). For example, M denotes Ga in some cases; meanwhile, M denotes the above metal element such as Ni or Fe in addition to Ga (Ga and Ni or Ga and Fe) in other cases. Further, the above oxide semiconductor may contain Fe, Ni, another transitional metal element, or an oxide of the transitional metal as an impurity element in addition to the metal element contained as M. In this specification, among the oxide semiconductors whose structures are expressed by $InMO_3(ZnO)_m$ (m>0), an oxide semiconductor which includes at least Ga as M is referred to as an In—Ga—Zn—O based oxide semiconductor, and a thin film of the In—Ga—Zn—O based oxide semiconductor is referred to as an In—Ga—Zn—O based non-single-crystal film.

As the oxide semiconductor which is applied to the oxide semiconductor layer, any of the following oxide semiconductors can be applied in addition to the above: an In—Sn—Zn—O based oxide semiconductor; an In—Al—Zn—O based oxide semiconductor; a Sn—Ga—Zn—O based oxide semiconductor; an Al—Ga—Zn—O based oxide semiconductor; a Sn—Al—Zn—O based oxide semiconductor; an In—Zn—O based oxide semiconductor; a Sn—Zn—O based oxide semiconductor; an Al—Zn—O based oxide semiconductor; an In—O based oxide semiconductor; a Sn—O based oxide semiconductor; and a Zn—O based oxide semiconductor. Silicon oxide may be included in the oxide semiconductor layer.

In one embodiment of the present invention disclosed in this specification, a gate electrode layer is formed over a substrate having an insulating surface; a gate insulating layer is formed over the gate electrode layer; an oxide semiconductor layer is formed over the gate insulating layer; the oxide semiconductor layer is heated under a nitrogen atmosphere; a source electrode layer and a drain electrode layer are formed over the heated oxide semiconductor layer; and a silicon oxide film is formed by a sputtering method over the gate insulating layer, the heated oxide semiconductor layer, the source electrode layer, and the drain electrode layer so that the silicon oxide film is in contact with part of the heated oxide semiconductor layer.

In another embodiment of the present invention disclosed in this specification, a gate electrode layer is formed over a substrate having an insulating surface; a gate insulating layer is formed over the gate electrode layer; an oxide semiconductor layer is formed over the gate insulating layer; a source electrode layer and a drain electrode layer are formed over the oxide semiconductor layer; the oxide semiconductor layer, the source electrode layer, and the drain electrode layer are heated under a nitrogen atmosphere; and a silicon oxide film is formed by a sputtering method over the gate insulating layer, the heated oxide semiconductor layer, the heated source electrode layer, and the heated drain electrode layer so that the silicon oxide film is in contact with part of the heated oxide semiconductor layer.

In another embodiment of the present invention disclosed in this specification, a gate electrode layer is formed over a substrate having an insulating surface; a gate insulating layer is formed over the gate electrode layer; a source electrode layer and a drain electrode layer are formed over the gate insulating layer; an oxide semiconductor layer is formed over the source electrode layer and the drain electrode layer; the oxide semiconductor layer is heated under a nitrogen atmosphere; and a silicon oxide film is formed by a sputtering method over the gate insulating layer, the source electrode layer, the drain electrode layer, and the heated oxide semiconductor layer so that the silicon oxide film is in contact with the heated oxide semiconductor layer.

In another embodiment of the present invention disclosed in this specification, a gate electrode layer is formed over a substrate having an insulating surface; a gate insulating layer is formed over the gate electrode layer; a first oxide semiconductor layer is formed over the gate insulating layer; the first oxide semiconductor layer is heated under a nitrogen atmosphere to reduce resistance, so that a low-resistance second semiconductor layer is formed; a conductive film is formed over the low-resistance second oxide semiconductor layer; the conductive film is selectively etched to expose part of the second oxide semiconductor layer overlapped with the gate electrode layer and to form a source electrode layer and a drain electrode layer; and a silicon oxide film is formed by a sputtering method over the second oxide semiconductor layer, the source electrode layer, and the drain electrode layer so that a region of the second oxide semiconductor layer in contact with the silicon oxide film has resistance higher than the second oxide semiconductor layer.

In another embodiment of the present invention disclosed in this specification, a gate electrode layer is formed over a substrate having an insulating surface; a gate insulating layer is formed over the gate electrode layer; a first oxide semiconductor layer is formed over the gate insulating layer; a conductive film is formed over the first oxide semiconductor layer; the conductive film is selectively etched to expose part of the first oxide semiconductor layer overlapped with the gate electrode layer and to form a source electrode layer and a drain electrode layer; the first oxide semiconductor layer, the source electrode layer, and the drain electrode layer are heated under a nitrogen atmosphere to reduce resistance of the first oxide semiconductor layer, so that a low-resistance second semiconductor layer is formed; and a silicon oxide film is formed by a sputtering method over the low-resistance second oxide semiconductor layer, the source electrode layer, and the drain electrode layer so that a region of the second oxide semiconductor layer in contact with the silicon oxide film has resistance higher than the second oxide semiconductor layer.

In another embodiment of the present invention disclosed in this specification, a gate electrode layer is formed over a substrate having an insulating surface; a gate insulating layer is formed over the gate electrode layer; a conductive film is formed over the gate insulating layer; the conductive film is selectively etched to form a source electrode layer and a drain electrode layer; a first oxide semiconductor layer is formed over the source electrode layer and the drain electrode layer; the first oxide semiconductor layer is heated under a nitrogen atmosphere to reduce resistance, so that a low-resistance second semiconductor layer is formed; and a silicon oxide film is formed by a sputtering method over the low-resistance second oxide semiconductor layer so that a region of the second oxide semiconductor layer in contact with the silicon oxide film has resistance higher than the second oxide semiconductor layer.

Since a thin film transistor is easily broken due to static electricity or the like, a protective circuit for protecting a driver circuit is preferably provided over the same substrate for a gate line or a source line. The protective circuit is preferably formed with a non-linear element including an oxide semiconductor.

Note that the ordinal numbers such as "first" and "second" in this specification are used for convenience and do not denote the order of steps and the stacking order of layers. In addition, the ordinal numbers in this specification do not denote particular names which specify the present invention.

Moreover, as a display device including a driver circuit, a light-emitting display device in which a light-emitting element is used and a display device in which an electrophoretic display element is used, which is also referred to as electronic paper, are given in addition to a liquid crystal display device.

In the light-emitting display device in which a light-emitting element is used, a plurality of thin film transistors are included in a pixel portion, and in the pixel portion, there is a region where a gate electrode of a thin film transistor is connected to a source wiring or a drain wiring of another thin film transistor. In addition, in a driver circuit of the light-emitting display device in which a light-emitting element is used, there is a region where a gate electrode of a thin film transistor is connected to a source wiring or a drain wiring of the thin film transistor.

In this specification, a semiconductor device means any device which can function by utilizing semiconductor characteristics, and an electro-optical device, a semiconductor circuit, and electronic equipment are all semiconductor devices.

A thin film transistor having stable electric characteristics can be provided. Therefore, a semiconductor device which includes highly reliable thin film transistors having favorable electric characteristics can be provided.

BRIEF DESCRIPTION OF THE DRAWINGS

In the accompanying drawings:

FIGS. 5A to 5D illustrate a method for manufacturing a semiconductor device;

FIGS. 6A to 6C illustrate a method for manufacturing a semiconductor device;

FIGS. 10A-1, 10A-2, and 10B illustrate semiconductor devices;

FIGS. 11A and 11B illustrate a semiconductor device;

DETAILED DESCRIPTION OF THE INVENTION

Figure 1A:
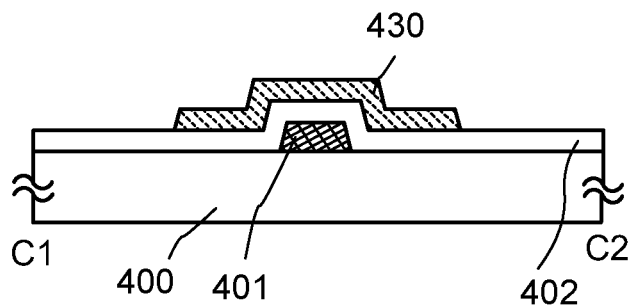
FIGS. 1A to 1D illustrate a method for manufacturing a semiconductor device.
Figure 1B:
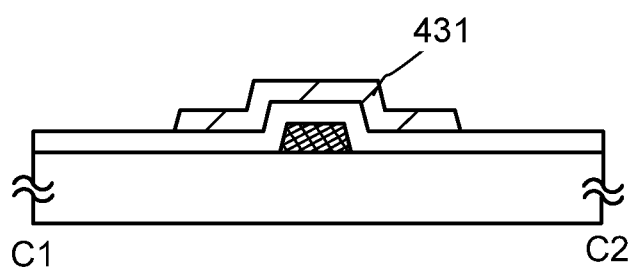

Embodiments will be described in detail with reference to the accompanying drawings. However, the present invention is not limited to the following description, and various changes for the modes and details thereof will be apparent to those skilled in the art unless such changes depart from the spirit and the scope of the invention. Therefore, this invention is not interpreted as being limited to the description of the embodiments below. In the structures to be given below, the same portions or portions having similar functions are denoted by the same reference numerals in different drawings, and explanation thereof will not be repeated.

Embodiment 1

A semiconductor device and a method for manufacturing a semiconductor device will be described with reference to FIGS. 1A to 1D, FIGS. 2A and 2B, and FIGS. 28A to 28D.

Figure 2A:
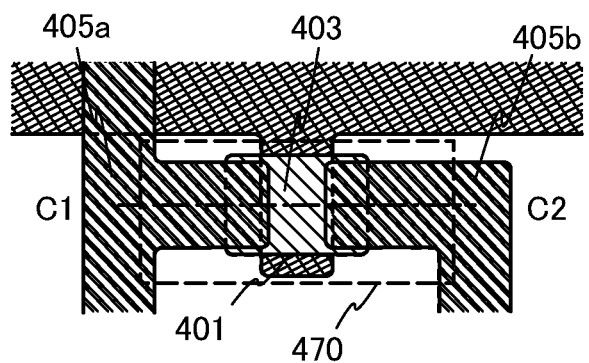
FIGS. 2A and 2B illustrate a semiconductor device.
Figure 2B:
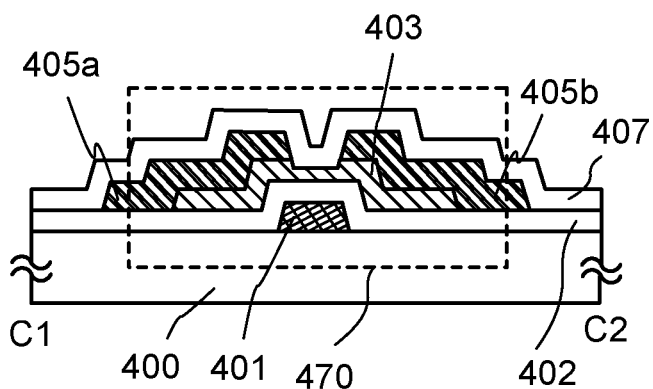

FIG. 2A is a plan view of a thin film transistor 470 of a semiconductor device, and FIG. 2B is a cross-sectional view taken along line C1-C2 of FIG. 2A. The thin film transistor 470 is an inverted staggered thin film transistor and includes, over a substrate 400 which is a substrate having an insulating surface, a gate electrode layer 401, a gate insulating layer 402, a semiconductor layer 403, and source and drain electrode layers 405a and 405b. In addition, an insulating film 407 in contact with the semiconductor layer 403 is provided to cover the thin film transistor 470.

The semiconductor layer 403 includes a high-resistance oxide semiconductor region at least in a region which is in contact with the insulating film 407, and the high-resistance oxide semiconductor region can serve as a channel formation region.

When the high-resistance oxide semiconductor region is used as a channel formation region, electric characteristics of a thin film transistor can be stabilized and increase in off current or the like can be prevented.

Note that as the source and drain electrode layers 405a and 405b which are in contact with the semiconductor layer 403 of the oxide semiconductor layer, a material including a metal having high oxygen affinity is preferably used. It is preferable that the metal with high oxygen affinity be one or more materials selected from titanium, aluminum, manganese, magnesium, zirconium, beryllium, and thorium. When heat treatment is performed while the semiconductor layer 403 and the metal layer having high oxygen affinity are in contact with each other, oxygen atoms move from the semiconductor layer 403 to the metal layer, the carrier density in the vicinity of an interface is increased, and a low-resistance region is formed. Accordingly, the thin film transistor 470 can have low contact resistance and large on current. The low-resistance region may be in a film shape having an interface.

As a result, a semiconductor device including the thin film transistor 470 having favorable electric characteristics and high reliability can be provided.

The semiconductor layer 403 including the channel formation region may be formed using an oxide material having semiconductor characteristics. For example, an oxide semiconductor having a structure expressed by $InMO_3(ZnO)_m$ (m>0) can be used. In particular, it is preferable to use an In—Ga—Zn—O based oxide semiconductor. Note that M denotes one or more of metal elements selected from gallium (Ga), iron (Fe), nickel (Ni), manganese (Mn), and cobalt (Co). For example, M denotes Ga in some cases; meanwhile, M denotes the above metal element such as Ni or Fe in addition to Ga (Ga and Ni or Ga and Fe) in other cases. Further, the above oxide semiconductor may contain Fe or Ni, another transitional metal element, or an oxide of the transitional metal as an impurity element in addition to the metal element contained as M. In this specification, among the oxide semiconductors having a structure expressed by $InMO_3(ZnO)_m$ (m>0), an oxide semiconductor which includes at least Ga as M is referred to as an In—Ga—Zn—O based oxide semiconductor, and a thin film of the In—Ga—Zn—O based oxide semiconductor is referred to as an In—Ga—Zn—O based non-single-crystal film.

As the oxide semiconductor which is applied to the oxide semiconductor layer, any of the following oxide semiconductors can be applied in addition to the above: an In—Sn—Zn—O based oxide semiconductor; an In—Al—Zn—O based oxide semiconductor; a Sn—Ga—Zn—O based oxide semiconductor; an Al—Ga—Zn—O based oxide semiconductor; a Sn—Al—Zn—O based oxide semiconductor; an In—Zn—O based oxide semiconductor; a Sn—Zn—O based oxide semiconductor; an Al—Zn—O based oxide semiconductor; an In—O based oxide semiconductor; a Sn—O based oxide semiconductor; and a Zn—O based oxide semiconductor. Further, silicon oxide may be included in the oxide semiconductor.

FIGS. 1A to 1D are cross-sectional views illustrating steps of manufacturing the thin film transistor 470.

In FIG. 1A, the gate electrode layer 401 is provided over the substrate 400 which is a substrate having an insulating surface. An insulating film serving as a base film may be provided between the substrate 400 and the gate electrode layer 401. The base film has a function of preventing diffusion of an impurity element from the substrate 400, and can be formed to have a single-layer or stacked-layer structure using one or more of a silicon nitride film, a silicon oxide film, a silicon nitride oxide film, and a silicon oxynitride film. The gate electrode layer 401 can be formed to have a single-layer or stacked-layer structure using a metal material such as molybdenum, titanium, chromium, tantalum, tungsten, aluminum, copper, neodymium, or scandium, or an alloy material which contains any of these materials as its main component.

For example, as a two-layer structure of the gate electrode layer 401, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, it is preferable to stack a tungsten layer or a tungsten nitride layer, a layer of an alloy of aluminum and silicon or a layer of an alloy of aluminum and titanium, and a titanium nitride layer or a titanium layer.

The gate insulating layer 402 is formed over the gate electrode layer 401.

The gate insulating layer 402 can be formed to have a single-layer or stacked layer structure using a silicon oxide layer, a silicon nitride layer, a silicon oxynitride layer, or a silicon nitride oxide layer by a plasma CVD method, a sputtering method, or the like. For example, a silicon oxynitride layer may be formed using a deposition gas containing $SiH_4$, oxygen, and nitrogen by a plasma CVD method. Alternatively, the gate insulating layer 402 can be formed using a silicon oxide layer by a CVD method in which an organosilane gas is used. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

An oxide semiconductor film is formed over the gate insulating layer 402.

Note that before the oxide semiconductor film is formed by a sputtering method, dust on a surface of the gate insulating layer 402 is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that a nitrogen atmosphere, a helium atmosphere, or the like may be used instead of an argon atmosphere. Alternatively, an argon atmosphere to which oxygen, $N_2O$, or the like is added may be used. Further alternatively, an argon atmosphere to which $Cl_2$, $CF_4$, or the like is added may be used.

As the oxide semiconductor film, an In—Ga—Zn—O based non-single-crystal film is used. The oxide semiconductor film is formed by a sputtering method with use of an In—Ga—Zn—O based oxide semiconductor target. Alternatively, the oxide semiconductor film can be formed by a sputtering method under a rare gas (typically argon) atmosphere, an oxygen atmosphere, or an atmosphere including a rare gas (typically argon) and oxygen.

The gate insulating layer 402 and the oxide semiconductor film may be formed successively without exposure to air. Successive film formation without exposure to air makes it possible to obtain each interface between stacked layers, which is not contaminated by atmospheric components or impurity elements floating in air, such as moisture, hydrocarbon, or the like. Therefore, variation in characteristics of the thin film transistor can be reduced.

The oxide semiconductor film is processed into an oxide semiconductor layer 430 (first oxide semiconductor layer), which is an island-shaped oxide semiconductor layer, by a photolithography step (see FIG. 1A).

The oxide semiconductor layer 430 is subjected to heat treatment under a nitrogen atmosphere. By the heat treatment under a nitrogen atmosphere, resistance of the oxide semiconductor layer 430 is reduced (increase in electrical conductivity, with preferable electrical conductivity of $1\times10^{-1}$ S/cm to $1\times10^2$ S/cm, inclusive). Accordingly, the oxide semiconductor layer 430 can be made into a low-resistance oxide semiconductor layer 431 (second oxide semiconductor layer) (see FIG. 1B).

The oxide semiconductor layer 430 is preferably subjected to heat treatment under a nitrogen atmosphere at 200° C. or higher. The oxide semiconductor layer may be subjected to the heat treatment under a nitrogen atmosphere before processed into the island-shaped oxide semiconductor layer 430.

A conductive film is formed over the gate insulating layer 402 and the oxide semiconductor layer 431.

As a material of the conductive film, an element selected from Al, Cr, Ta, Ti, Mo, and W; an alloy containing any of the above elements as its component; an alloy film containing these elements in combination; and the like can be given.

Alternatively, as a material of the conductive film, a film of titanium which is a metal having high oxygen affinity is preferably used. In addition, an element selected from Al, Cr, Ta, Mo, and W, an alloy containing any of the above elements, an alloy film containing these elements in combination, and the like may be stacked over the titanium film.

Further, when heat treatment is performed at 200° C. to 600° C., the conductive film preferably has heat resistance enough to withstand the heat treatment. Since use of Al alone brings disadvantages such as low heat resistance and a tendency to be corroded, aluminum is used in combination with a conductive material having heat resistance. As the conductive material having heat resistance which is used in combination with Al, any of the following materials may be used: an element selected from titanium (Ti), tantalum (Ta), tungsten (W), molybdenum (Mo), chromium (Cr), neodymium (Nd), and scandium (Sc), an alloy containing any of the above elements as a component, an alloy film containing these elements in combination, and a nitride containing any of these elements as a component.

Figure 1C:
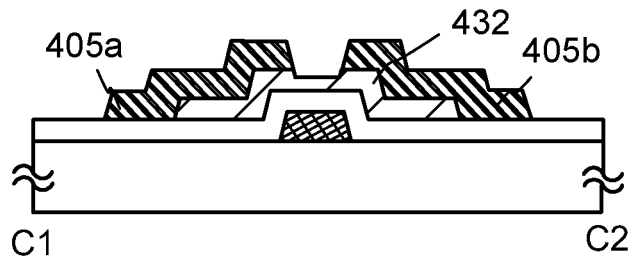
Figure 1D:
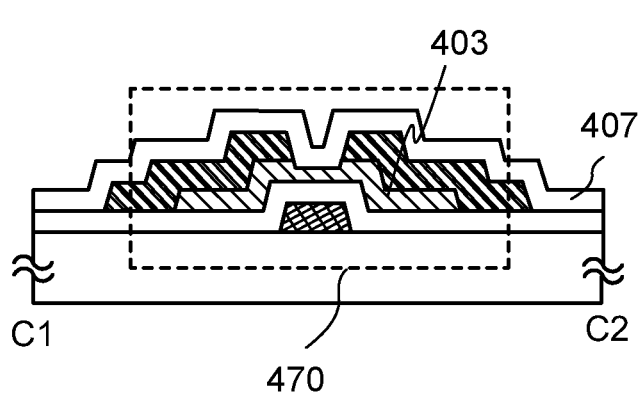

The oxide semiconductor layer 431 and the conductive film are etched in an etching step, so that an oxide semiconductor layer 432 and the source and drain electrode layers 405a and 405b are formed (see FIG. 1C). Note that only part of the oxide semiconductor layer 431 is etched to be the oxide semiconductor layer 432 having a groove (depression).

The oxide semiconductor layer may be subjected to heat treatment under a nitrogen atmosphere after formation of the source and drain electrode layers 405a and 405b as illustrated in FIGS. 28A to 28D. The gate electrode layer 401, the gate insulating layer 402, and the oxide semiconductor layer 430 are formed over the substrate 400 having an insulating surface (see FIG. 28A). The source and drain electrode layers 405a and 405b are formed over the oxide semiconductor layer 430, and part of the oxide semiconductor layer 430 is etched to form an oxide semiconductor layer 441 (see FIG. 28B). Then, heat treatment is performed on the oxide semiconductor layer 441 and the source and drain electrode layers 405a and 405b under a nitrogen atmosphere. This heat treatment reduces resistance of the oxide semiconductor layer 441 and the oxide semiconductor layer 441 can be made into the low-resistance oxide semiconductor layer 432 (see FIG. 28C).

A silicon oxide film is formed as the insulating film 407 to be in contact with the oxide semiconductor layer 432 by a sputtering method. When the insulating film 407 of the silicon oxide film is formed by a sputtering method to be in contact with the low-resistance oxide semiconductor layer 432, in the low-resistance oxide semiconductor layer 432, resistance of at least a region in contact with the insulating film 407 of the silicon oxide film can be increased (decrease in electrical conductivity). Accordingly, the region becomes a high-resistance oxide semiconductor region. Therefore, the oxide semiconductor layer 432 becomes the semiconductor layer 403 (third oxide semiconductor layer) having a high-resistance oxide semiconductor region, and the thin film transistor 470 can be manufactured (see FIG. 1D and FIG. 28D).

The silicon oxide film to be the insulating film 407 can be formed by a sputtering method under a rare gas (typically argon) atmosphere, an oxygen atmosphere, or an atmosphere including a rare gas (typically argon) and oxygen. Further, a silicon oxide target or a silicon target may be used as a target. For example, the silicon oxide film can be formed using a silicon target by a sputtering method under an atmosphere including oxygen and nitrogen.

Further, after the silicon oxide film to be the insulating film 407 is formed, the thin film transistor 470 may be subjected to heat treatment (preferably at 300° C. or lower) under a nitrogen atmosphere or an atmospheric atmosphere (air atmosphere). For example, heat treatment is performed at 350° C. for one hour under a nitrogen atmosphere. The heat treatment can reduce variation in electric characteristics of the thin film transistor 470.

The channel formation region in the semiconductor layer is a high-resistance region; thus, electric characteristics of the thin film transistor are stabilized and increase in off current can be prevented. Therefore, a semiconductor device including a highly reliable thin film transistor having favorable electric characteristics can be provided.

Embodiment 2

A semiconductor device and a method for manufacturing the semiconductor device are described with reference to FIGS. 3A to 3D and FIGS. 4A and 4B. The same portion as or a portion having similar function to those described in Embodiment 1 can be formed in a manner similar to that described in Embodiment 1; therefore, repetitive description is omitted.

Figure 4A:
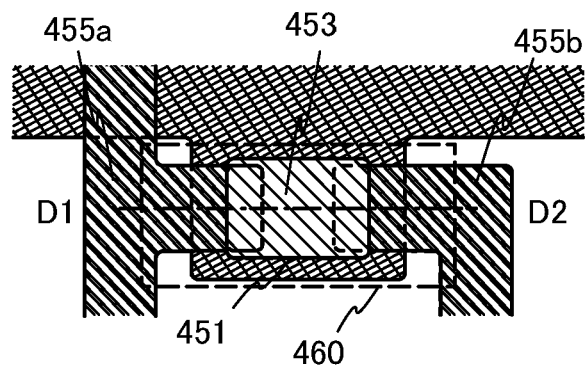
FIGS. 4A and 4B illustrate a semiconductor device.
Figure 4B:
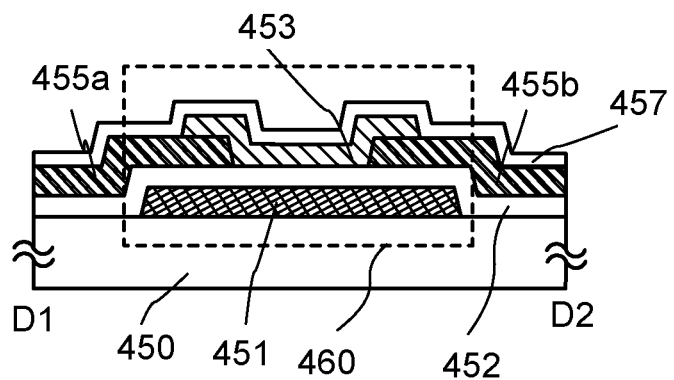

FIG. 4A is a plan view of a thin film transistor 460 included in a semiconductor device, and FIG. 4B is a cross-sectional view taken along line D1-D2 of FIG. 4A. The thin film transistor 460 is a bottom gate thin film transistor and includes, over a substrate 450 which is a substrate having an insulating surface, a gate electrode layer 451, a gate insulating layer 452, source and drain electrode layers 455a and 455b, and a semiconductor layer 453. In addition, an insulating film 457 is provided to cover the thin film transistor 460 and be in contact with the semiconductor layer 453. An In—Ga—Zn—O based non-single-crystal film is used for the semiconductor layer 453.

In the thin film transistor 460, the gate insulating layer 452 exists in the entire region including the thin film transistor 460, and the gate electrode layer 451 is provided between the gate insulating layer 452 and the substrate 450 which is a substrate having an insulating surface. The source and drain electrode layers 455*a* and 455*b* are provided over the gate insulating layer 452. Further, the semiconductor layer 453 is provided over the gate insulating layer 452 and the source and drain electrode layers 455*a* and 455*b*. Although not illustrated, a wiring layer is provided over the gate insulating layer 452 in addition to the source and drain electrode layers 455*a* and 455*b*, and the wiring layer extends beyond the peripheral portion of the semiconductor layer 453.

The semiconductor layer 453 includes a high-resistance oxide semiconductor region at least in a region which is in contact with the insulating film 457, and the high-resistance oxide semiconductor region can serve as a channel formation region.

When the high-resistance oxide semiconductor region is used as a channel formation region, electric characteristics of a thin film transistor can be stabilized and increase in off current or the like can be prevented.

Note that as the source and drain electrode layers 455*a* and 455*b* which are in contact with the semiconductor layer 453 of the oxide semiconductor layer, a material including a metal having high oxygen affinity is preferably used. It is preferable that the metal with high oxygen affinity be one or more materials selected from titanium, aluminum, manganese, magnesium, zirconium, beryllium, and thorium. When heat treatment is performed while the semiconductor layer 453 and the metal layer having high oxygen affinity are in contact with each other, oxygen atoms move from the semiconductor layer 453 to the metal layer, the carrier density in the vicinity of an interface is increased, and a low-resistance region is formed. Accordingly, the thin film transistor 460 can have low contact resistance and large on current. The low resistant region may be in a film shape having an interface.

As a result, a semiconductor device including the thin film transistor 460 having favorable electric characteristics and high reliability can be provided.

FIGS. 3A to 3D are cross-sectional views illustrating steps of manufacturing the thin film transistor 460.

The gate electrode layer 451 is provided over the substrate 450 which is a substrate having an insulating surface. An insulating film serving as a base film may be provided between the substrate 450 and the gate electrode layer 451. The base film has a function of preventing diffusion of an impurity element from the substrate 450, and can be formed to have a single-layer or stacked-layer structure using one or more of a silicon nitride film, a silicon oxide film, a silicon nitride oxide film, and a silicon oxynitride film. The gate electrode layer 451 can be formed to have a single-layer or stacked-layer structure using a metal material such as molybdenum, titanium, chromium, tantalum, tungsten, aluminum, copper, neodymium, or scandium, or an alloy material which contains any of these materials as its main component.

The gate insulating layer 452 is formed over the gate electrode layer 451.

The gate insulating layer 452 can be formed to have a single-layer or stacked layer structure using a silicon oxide layer, a silicon nitride layer, a silicon oxynitride layer, or a silicon nitride oxide layer by a plasma CVD method, a sputtering method, or the like. Alternatively, the gate insulating layer 452 can be formed using a silicon oxide layer by a CVD method using an organosilane gas.

Figure 3A:
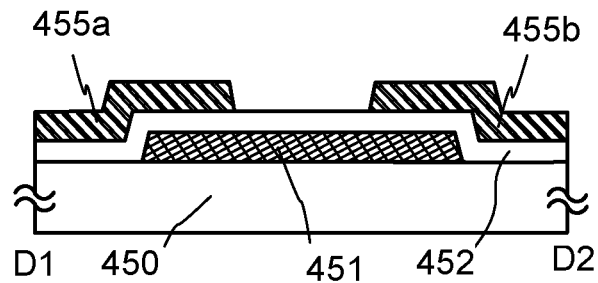
FIGS. 3A to 3D illustrate a method for manufacturing a semiconductor device.

A conductive film is formed over the gate insulating layer 452 and processed into the island-shaped source and drain electrode layers 455*a* and 455*b* by a photolithography step (see FIG. 3A).

As a material of the source and drain electrode layers 455*a* and 455*b*, an element selected from Al, Cr, Ta, Ti, Mo, and W; an alloy containing any of the above elements as its component; an alloy film containing these elements in combination; and the like can be given.

Alternatively, as a material of the source and drain electrode layers 455*a* and 455*b*, a film of titanium which is a metal having high oxygen affinity is preferably used. In addition, an element selected from Al, Cr, Ta, Mo, and W, an alloy containing any of the above elements as its component, an alloy film containing these elements in combination, and the like may be stacked over the titanium film.

Further, when heat treatment is performed at 200° C. to 600° C., the conductive film preferably has heat resistance enough to withstand the heat treatment. Since use of Al alone brings disadvantages such as low heat resistance and a tendency to be corroded, aluminum is used in combination with a conductive material having heat resistance. As the conductive material having heat resistance which is used in combination with Al, any of the following materials may be used: an element selected from titanium (Ti), tantalum (Ta), tungsten (W), molybdenum (Mo), chromium (Cr), neodymium (Nd), and scandium (Sc), an alloy containing any of the above elements as a component, an alloy film containing these elements in combination, and a nitride containing any of these elements as a component.

Figure 3B:
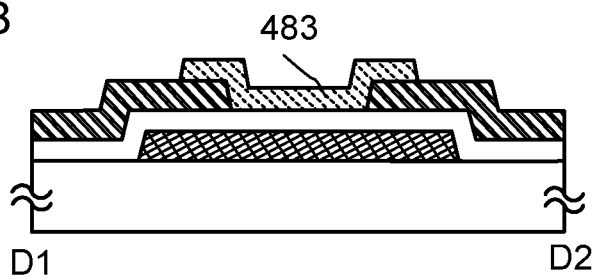
Figure 3C:
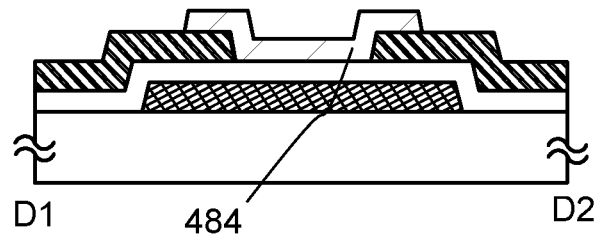
Figure 3D:
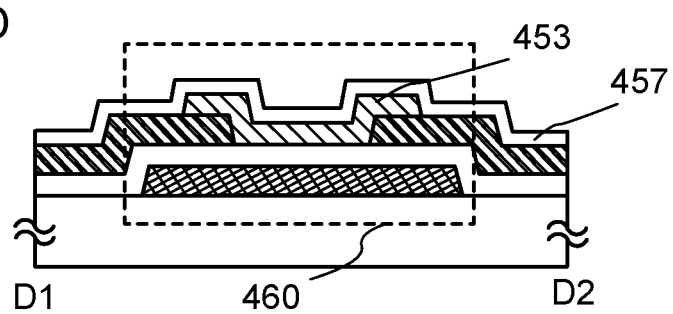

Then, an oxide semiconductor film is formed over the gate insulating layer 452 and the source and drain electrode layers 455*a* and 455*b*, and processed into an island-shaped oxide semiconductor layer 483 (first oxide semiconductor layer) by a photolithography step (see FIG. 3B).

The oxide semiconductor layer 483 serves as a channel formation region and is thus formed in a manner similar to the oxide semiconductor film in Embodiment 1.

Note that before the oxide semiconductor layer 483 is formed by a sputtering method, dust on a surface of the gate insulating layer 452 is preferably removed by reverse sputtering in which an argon gas is introduced and plasma is generated.

The oxide semiconductor layer 483 is subjected to heat treatment under a nitrogen atmosphere. By the heat treatment under a nitrogen atmosphere, resistance of the oxide semiconductor layer 483 is reduced (increase in electrical conductivity, with preferable electrical conductivity of $1\times10^{-1}$ S/cm to $1\times10^2$ S/cm, inclusive). Accordingly, the oxide semiconductor layer 483 can be made into a low-resistance oxide semiconductor layer 484 (second oxide semiconductor layer) (see FIG. 3C).

The oxide semiconductor layer 483 is preferably subjected to heat treatment under a nitrogen atmosphere at 200° C. or higher.

A silicon oxide film is formed as the insulating film 457 to be in contact with the oxide semiconductor layer 484 by a sputtering method. When the insulating film 457 of the silicon oxide film is formed by a sputtering method to be in contact with the low-resistance oxide semiconductor layer 484, in the low-resistance semiconductor layer 484, resistance of at least a region in contact with the insulating film 457 of the silicon oxide film can be increased (decrease in electrical conductivity). Accordingly, the region becomes a high-resistance oxide semiconductor region. Therefore, the oxide semiconductor layer 484 becomes the semiconductor layer 453 (third oxide semiconductor layer) having a high-resistance oxide semiconductor region, and the thin film transistor 460 can be manufactured (see FIG. 3D).

The silicon oxide film to be the insulating film 457 can be formed by a sputtering method under a rare gas (typically argon) atmosphere, an oxygen atmosphere, or an atmosphere including a rare gas (typically argon) and oxygen. Further, a silicon oxide target or a silicon target may be used as a target. For example, the silicon oxide film can be formed using a silicon target by a sputtering method under an atmosphere including oxygen and nitrogen.

Further, after the silicon oxide film to be the insulating film 457 is formed, the thin film transistor 460 may be subjected to heat treatment (preferably at 300° C. or lower) under a nitrogen atmosphere or an atmospheric atmosphere (air atmosphere). For example, heat treatment is performed at 350° C. for one hour under a nitrogen atmosphere. The heat treatment can reduce variation in electric characteristics of the thin film transistor 460.

The channel formation region in the semiconductor layer is a high-resistance region; thus, electric characteristics of the thin film transistor are stabilized and increase in off current can be prevented. Therefore, a semiconductor device including a highly reliable thin film transistor having favorable electric characteristics can be provided.

Embodiment 3

A manufacturing process of a semiconductor device including a thin film transistor is described with reference to FIGS. 5A to 5D, FIGS. 6A to 6C, FIG. 7, and FIGS. 8A-1, 8A-2, 8B-1, and 8B-2.

In FIG. 5A, a glass substrate of barium borosilicate glass, aluminoborosilicate glass, or the like can be used for a substrate 100 having a light-transmitting property.

Next, after a conductive layer is formed over an entire surface of the substrate 100, a first photolithography step is performed to form a resist mask, and then an unnecessary portion is etched away, so that wirings and electrodes (a gate wiring including a gate electrode layer 101, a capacitor wiring 108, and a first terminal 121) are formed. At this time, the etching is performed so that at least end portions of the gate electrode layer 101 have a tapered shape.

Each of the gate wiring including the gate electrode layer 101, the capacitor wiring 108, and the first terminal 121 at a terminal portion is preferably formed using a conductive material having heat resistance, such as an element selected from titanium (Ti), tantalum (Ta), tungsten (W), molybdenum (Mo), chromium (Cr), neodymium (Nd), and scandium (Sc); an alloy containing any of these elements as its component; an alloy film containing these elements in combination; or a nitride containing any of these elements as its component. In the case of using a conductive material having low resistance such as aluminum (Al) or copper (Cu), the conductive material having low resistance is used in combination with the above heat-resistant conductive material because use of Al alone or Cu alone brings disadvantages such as low heat resistance and a tendency to be corroded.

Next, a gate insulating layer 102 is formed over an entire surface of the gate electrode layer 101. The gate insulating layer 102 is formed to a thickness of 50 nm to 250 nm by a sputtering method, a CVD method, or the like.

For example, as the gate insulating layer 102, a silicon oxide film is formed to a thickness of 100 nm by a sputtering method. Needless to say, the gate insulating layer 102 is not limited to such a silicon oxide film. The gate insulating layer 102 may be a single layer or a stack of layers including another insulating film, such as a silicon oxynitride film, a silicon nitride film, an aluminum oxide film, or a tantalum oxide film.

Next, an oxide semiconductor film (In—Ga—Zn—O based non-single-crystal film) is formed over the gate insulating layer 102. It is effective to deposit the In—Ga—Zn—O based non-single-crystal film without exposure to air after the plasma treatment because dust and moisture are not attached to the interface between the gate insulating layer and the semiconductor film. Here, the oxide semiconductor film is formed in an oxygen atmosphere, an argon atmosphere, or an atmosphere containing argon and oxygen under the condition where a target is an oxide semiconductor target containing In, Ga, and Zn (In—Ga—Zn—O based oxide semiconductor target ($In_2O_3$:$Ga_2O_3$:ZnO=1:1:1 [molar ratio])) with a diameter of 8 inches, the distance between the substrate and the target is 170 mm, the pressure is 0.4 Pa, and the direct current (DC) power supply is 0.5 kW. Note that use of a pulse direct current (DC) power supply is preferable because dust can be reduced and the film thickness can be uniform. The In—Ga—Zn—O based non-single-crystal film is formed to have a thickness of 5 nm to 200 nm. As the oxide semiconductor film, an In—Ga—Zn—O based non-single-crystal film with the thickness of 50 nm is formed using the In—Ga—Zn—O based oxide semiconductor target by a sputtering method.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is a multi-source sputtering apparatus in which a plurality of targets of different materials can be set. With the multi-source sputtering apparatus, films of different materials can be stacked in the same chamber, or a film of plural kinds of materials can be formed by electric discharge at the same time in the same chamber.

In addition, there are a sputtering apparatus provided with a magnet system inside the chamber and used for a magnetron sputtering method, and a sputtering apparatus used for an ECR sputtering in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin compound film thereof, and a bias sputtering in which a voltage is also applied to a substrate during deposition.

Next, a second photolithography step is performed to form a resist mask, and then the oxide semiconductor film is etched. For example, unnecessary portions are removed by wet etching using a mixed solution of phosphoric acid, acetic acid, and nitric acid, so that an oxide semiconductor layer 133 is formed. Note that etching here is not limited to wet etching and dry etching may also be performed.

As an etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the films into desired shapes, the etching conditions (the amount of electric power applied to a coil-shaped electrode, the amount of electric power applied to an electrode on a substrate side, the temperature of the electrode on the substrate side, or the like) are adjusted as appropriate.

As an etchant used for wet etching, a mixed solution of phosphoric acid, acetic acid, and nitric acid, an ammonia peroxide mixture (hydrogen peroxide:ammonia:water=5:2:2), or the like can be used. Alternatively, ITO07N (produced by KANTO CHEMICAL CO., INC.) may also be used.

The etchant used in the wet etching is removed by cleaning together with the material which is etched off. The waste liquid including the etchant and the material etched off may be purified to recycle the materials contained in the waste liquid. When a material such as indium included in the oxide semiconductor layer is collected from the waste liquid after the etching and reused, the resources can be efficiently used and thus the cost can be reduced.

The etching conditions (such as an etchant, etching time, and temperature) are adjusted as appropriate depending on the material so that the material can be etched into a desired shape.

Next, the oxide semiconductor layer 133 is subjected to heat treatment under a nitrogen atmosphere.

The heat treatment is preferably performed at 200° C. or higher. For example, heat treatment is performed at 350° C. for one hour under a nitrogen atmosphere. By the heat treatment under a nitrogen atmosphere, resistance of the oxide semiconductor layer 133 is reduced and conductivity is increased. Accordingly, a low-resistance oxide semiconductor layer 134 is formed (see FIG. 5B). The electrical conductivity of the oxide semiconductor layer 134 is preferably $1 \times 10^{-1}$ S/cm to $1 \times 10^{2}$ S/cm, inclusive. Note that the heat treatment may be performed after formation of source and drain electrode layers.

Next, a conductive film 132 is formed using a metal material over the oxide semiconductor layer 134 by a sputtering method or a vacuum evaporation method (see FIG. 5C).

As a material of the conductive film 132, an element selected from Al, Cr, Ta, Ti, Mo, and W; an alloy containing any of the above elements as its component; an alloy film containing these elements in combination; and the like can be given.

Further, when heat treatment is performed at 200° C. to 600° C., the conductive film preferably has heat resistance enough to withstand the heat treatment. Since use of Al alone brings disadvantages such as low heat resistance and a tendency to be corroded, aluminum is used in combination with a conductive material having heat resistance. As the conductive material having heat resistance which is used in combination with Al, any of the following materials may be used: an element selected from titanium (Ti), tantalum (Ta), tungsten (W), molybdenum (Mo), chromium (Cr), neodymium (Nd), and scandium (Sc), an alloy containing any of the above elements as a component, an alloy film containing these elements in combination, and a nitride containing any of these elements as a component.

As a material of the conductive film 132, a film of titanium which is a metal with high oxygen affinity is preferably used. Alternatively, the conductive film 132 may have a two-layer structure of an aluminum film and a titanium film stacked thereover. Still alternatively, the conductive film 132 may have a three-layer structure in which a Ti film, an aluminum film containing Nd (Al—Nd), and another Ti film are stacked in this order. The conductive film 132 may have a single-layer structure of an aluminum film containing silicon.

Next, a third photolithography step is performed to form a resist mask and then unnecessary portions are etched away, so that source and drain electrode layers 105a and 105b and a second terminal 122 are formed (see FIG. 5D). Wet etching or dry etching is employed as an etching method at this time. For example, when an aluminum film or an aluminum alloy film is used as the conductive film 132, wet etching using a mixed solution of phosphoric acid, acetic acid, and nitric acid can be performed. Alternatively, the conductive film 132 may be wet-etched using an ammonia peroxide mixture (hydrogen peroxide:ammonia:water=5:2:2) to form the source and drain electrode layers 105a and 105b. In this etching step, an exposed region of the oxide semiconductor layer 134 is partly etched to be a semiconductor layer 135. Therefore, a region of the semiconductor layer 135, which lies between the source and drain electrode layers 105a and 105b has a small thickness. In FIG. 5D, the etching for forming the source and drain electrode layers 105a and 105b and the semiconductor layer 135 is performed at a time by dry etching. Accordingly, an end portion of the source or drain electrode layer 105a and an end portion of the source or drain electrode layer 105b are aligned with end portions of the semiconductor layer 135; thus, continuous structures are formed.

In the third photolithography step, the second terminal 122 which is formed using the same material as the source and drain electrode layers 105a and 105b is left in a terminal portion. Note that the second terminal 122 is electrically connected to a source wiring (a source wiring including the source and drain electrode layers 105a and 105b).

Further, with use of a resist mask having regions with plural thicknesses (typically, two different thicknesses) which is formed using a multi-tone mask, the number of resist masks can be reduced, resulting in simplified process and lower cost.

Here, the semiconductor layer 135 of the oxide semiconductor layer and the source and drain electrode layers 105a and 105b may be subjected to heat treatment. In the case where the source and drain electrode layers 105a and 105b are formed using a metal with high oxygen affinity, oxygen atoms move from the oxide semiconductor layer to the source and drain electrode layers 105a and 105b by the heat treatment, whereby a region in contact with the source and drain electrode layers 105a and 105b can be made into a low resistance region. The low resistance region which is formed between the source and drain electrode layers 105a and 105b and the semiconductor layer 135 may be in a film shape having an interface.

Then, a protective insulating layer 107 is formed to cover the gate insulating layer 102, the oxide semiconductor layer 135, and the source and drain electrode layers 105a and 105b. As the protective insulating layer 107, a silicon oxide film is formed by a sputtering method. An exposed region of the oxide semiconductor layer 135, which is provided between the source and drain electrode layers 105a and 105b, and the silicon oxide film which is the protective insulating layer 107 are provided in contact with each other, so that resistance of the region in the oxide semiconductor layer 135, which is in contact with the protective insulating layer 107, is increased (decrease in electrical conductivity), and thus a semiconductor layer 103 which includes a channel formation region with high resistance can be formed (see FIG. 6A).

Through the above steps, a thin film transistor 170 can be manufactured.

Heat treatment may be performed after formation of the thin film transistor 170. The heat treatment may be performed at 300° C. or higher under an oxygen atmosphere or a nitrogen atmosphere. The heat treatment can reduce variation in electric characteristics of the thin film transistor.

Next, a fourth photolithography step is performed to form a resist mask. The protective insulating layer 107 and the gate insulating layer 102 are etched to form a contact hole 125 that reaches the source electrode layer or the drain electrode layer 105b. In addition, a contact hole 127 that reaches the second terminal 122 and a contact hole 126 that reaches the first terminal 121 are also formed in the same etching step. A cross-sectional view at this stage is illustrated in FIG. 6B.

Next, the resist mask is removed, and then a transparent conductive film is formed. The transparent conductive film is formed using indium oxide ($In_2O_3$), indium oxide-tin oxide alloy ($In_2O_3$—$SnO_2$, abbreviated to ITO), or the like by a sputtering method, a vacuum evaporation method, or the like. Such a material is etched with a hydrochloric acid based solution. However, since a residue is easily generated particularly in etching ITO, indium oxide-zinc oxide alloy ($In_2O_3$—ZnO) may be used to improve etching processability.

Next, a fifth photolithography step is performed to form a resist mask. Then, an unnecessary portion is etched away, so that a pixel electrode layer 110 is formed.

Through the fifth photolithography step, a storage capacitor is formed with the capacitor wiring 108 and the pixel electrode layer 110, in which the gate insulating layer 102 and the protective insulating layer 107 in the capacitor portion are used as a dielectric.

In addition, in the fifth photolithography step, the first terminal 121 and the second terminal 122 are covered with the resist mask, and transparent conductive films 128 and 129 are left in the terminal portions. The transparent conductive films 128 and 129 function as electrodes or wirings connected to an FPC. The transparent conductive film 128 formed over the first terminal 121 is a connection terminal electrode serving as an input terminal of a gate wiring. The transparent conductive film 129 formed over the second terminal 122 is a connection terminal electrode serving as an input terminal of a source wiring.

Figure 7:
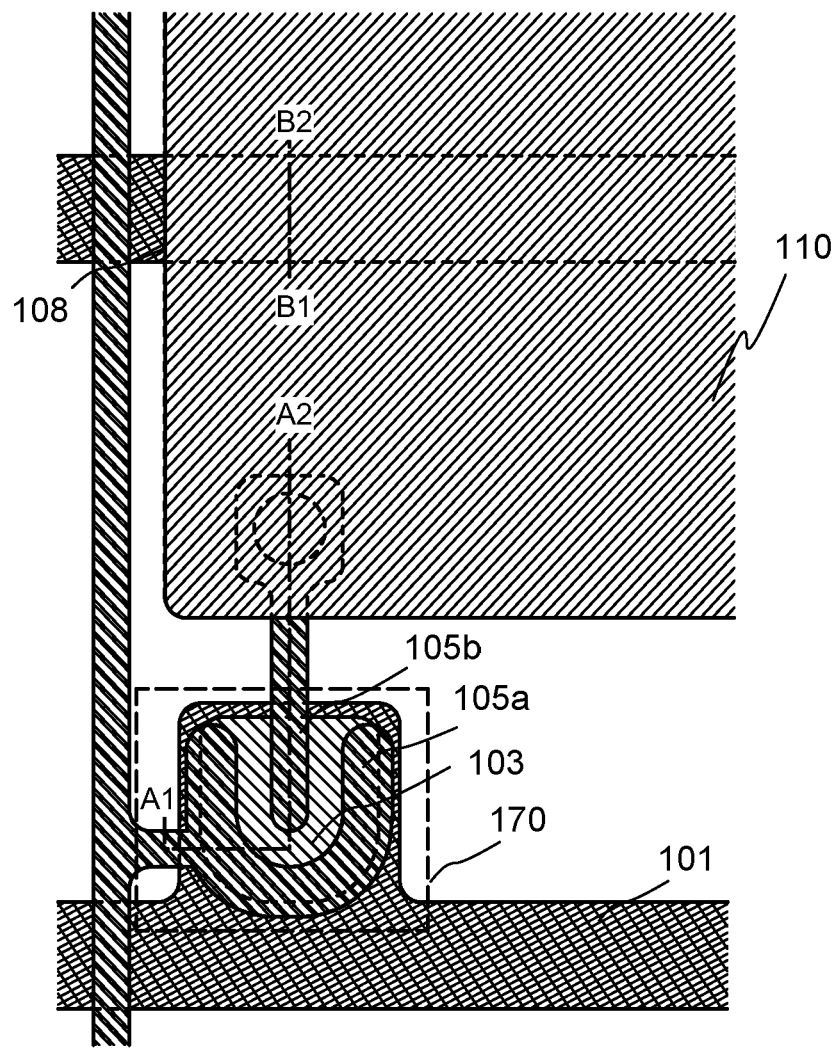
FIG. 7 illustrates a semiconductor device.

Then, the resist mask is removed. A cross-sectional view at this stage is illustrated in FIG. 6C. Note that FIG. 7 is a top view at this stage.

Figures 1, 8A:
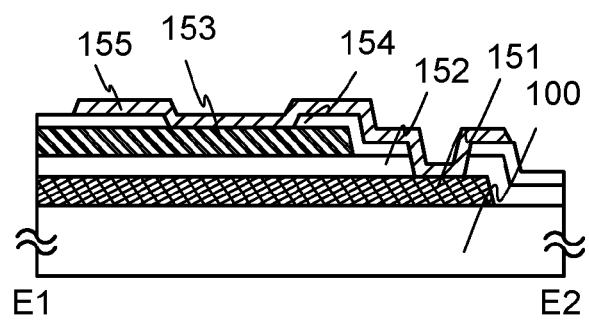
FIGS. 8A-1, 8A-2, 8B-1, and 8B-2 illustrate semiconductor devices.
Figures 2, 8A:
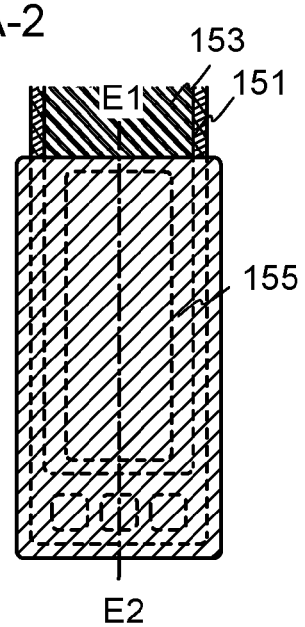

Further, FIGS. 8A-1 and 8A-2 are a cross-sectional view of a gate wiring terminal portion at this stage and a plan view thereof, respectively. The cross-sectional view of FIG. 8A-1 is taken along line E1-E2 of FIG. 8A-2. In FIG. 8A-1, a transparent conductive film 155 formed over a protective insulating film 154 is a connection terminal electrode serving as an input terminal. Furthermore, in the terminal portion illustrated in FIG. 8A-1, a first terminal 151 formed using the same material as the gate wiring and a connection electrode layer 153 formed using the same material as the source wiring overlap with each other with a gate insulating layer 152 interposed therebetween, and are electrically connected to each other through the transparent conductive film 155. Note that a portion where the conductive film 128 and the first terminal 121 are in contact with each other in FIG. 6C corresponds to a portion where the transparent conductive film 155 and the first terminal 151 are in contact with each other in FIG. 8A-1.

Figures 1, 8B:
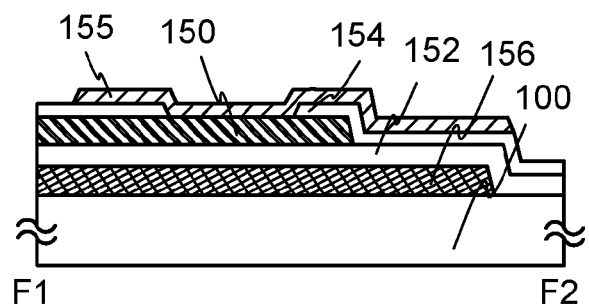
Figures 2, 8B:
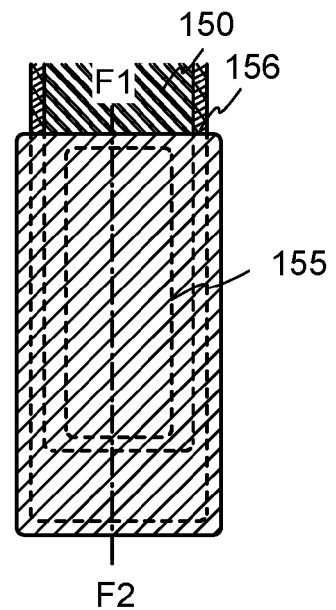

FIGS. 8B-1 and 8B-2 are a cross-sectional view of a source wiring terminal portion which is different from that illustrated in FIG. 6C and a top view thereof, respectively. The cross-sectional view of FIG. 8B-1 is taken along line F1-F2 of FIG. 8B-2. In FIG. 8B-1, the transparent conductive film 155 formed over the protective insulating film 154 is a connection terminal electrode serving as an input terminal. Furthermore, in the terminal portion illustrated in FIG. 8B-1, an electrode layer 156 formed using the same material as the gate wiring is located below and overlapped with a second terminal 150 which is electrically connected to the source wiring, with a gate insulating layer 152 interposed therebetween. The electrode layer 156 is not electrically connected to the second terminal 150, and a capacitor to prevent noise or static electricity can be formed when the potential of electrode layer 156 is set to a potential different from that of the second terminal 150, such as floating, GND, or 0 V. The second terminal 150 is electrically connected to the transparent conductive film 155 with the protective insulating film 154 interposed therebetween.

A plurality of gate wirings, source wirings, and capacitor wirings are provided depending on the pixel density. Also in the terminal portion, a plurality of first terminals at the same potential as the gate wirings, second terminals at the same potential as the source wirings, third terminals at the same potential as the capacitor wirings, and the like are arranged. The number of each of the terminals may be any number, and the number of the terminals may be determined by a practitioner as appropriate.

Through these five photolithography steps, the storage capacitor and a pixel thin film transistor portion including the thin film transistor 170 of a bottom-gate staggered thin film transistor can be completed using the five photomasks. The storage capacitor and the thin film transistor portion are arranged in matrix corresponding to pixels so that a pixel portion is formed, whereby one of substrates for manufacturing an active matrix display device can be obtained. In this specification, such a substrate is referred to as an active matrix substrate for convenience.

In the case of manufacturing an active matrix liquid crystal display device, an active matrix substrate and a counter substrate provided with a counter electrode are bonded to each other with a liquid crystal layer interposed therebetween. Note that a common electrode which is electrically connected to the counter electrode on the counter substrate is provided over the active matrix substrate, and a fourth terminal which is electrically connected to the common electrode is provided in the terminal portion. The fourth terminal is provided so that the common electrode is set to a fixed potential such as GND or 0 V.

Alternatively, a pixel electrode may be overlapped with a gate wiring of adjacent pixel with a protective insulating film and a gate insulating layer interposed therebetween to form a storage capacitor without a capacitor wiring.

In an active matrix liquid crystal display device, pixel electrodes arranged in matrix are driven to form a display pattern on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In displaying moving images, a liquid crystal display device has a problem in that a long response time of liquid crystal molecules themselves causes afterimages or blurring of moving images. In order to improve the moving-image characteristics of a liquid crystal display device, a driving method called black insertion is employed in which black is displayed on the whole screen every other frame period.

Moreover, a driving method called double-frame rate driving may be employed in which the vertical synchronizing frequency is 1.5 times or more, preferably twice or more as high as a conventional vertical synchronizing frequency, whereby the moving-image characteristics are improved.

Alternatively, in order to improve the moving-image characteristics of a liquid crystal display device, a driving method may be employed, in which a plurality of LEDs (light-emitting diodes) or a plurality of EL light sources are used to form a surface light source as a backlight and each light source of the surface light source is independently driven to perform intermittent lighting in one frame period. As the surface light source, three or more kinds of LEDs may be used and an LED emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed.

By combining these driving methods, the display characteristics of a liquid crystal display device, such as moving-image characteristics, can be improved as compared to those of conventional liquid crystal display devices.

The n-channel transistor disclosed in this specification includes an oxide semiconductor film which is used for a channel formation region and has good dynamic characteristics; thus, it can be combined with these driving techniques.

In manufacturing a light-emitting display device, one electrode (also referred to as a cathode) of an organic light-emitting element is set to a low power supply potential such as GND or 0 V; therefore, a terminal portion is provided with the fourth terminal for setting the cathode to a low power supply potential such as GND or 0 V. Further, in manufacturing a light-emitting display device, a power supply line is provided in addition to a source wiring and a gate wiring. Accordingly, the terminal portion is provided with a fifth terminal electrically connected to the power supply line.

The use of an oxide semiconductor for a thin film transistor can reduce manufacturing cost.

The channel formation region in the semiconductor layer is a high-resistance region; thus, electric characteristics of the thin film transistor are stabilized and increase in off current can be prevented. Therefore, a semiconductor device including a highly reliable thin film transistor having favorable electric characteristics can be provided.

This embodiment can be implemented in appropriate combination with the structures described in the other embodiments.

Embodiment 4

An example of a display device which is one example of a semiconductor device will be described. In the display device, at least part of a driver circuit and a thin film transistor to be disposed in a pixel portion are formed over the same substrate.

The thin film transistor in the pixel portion is formed in accordance with any of Embodiments 1 to 3. The thin film transistor described in any of Embodiments 1 to 3 is an n-channel TFT; therefore, part of a driver circuit which can be formed using an n-channel TFT is formed over the same substrate as the thin film transistor in the pixel portion.

Figure 14A:
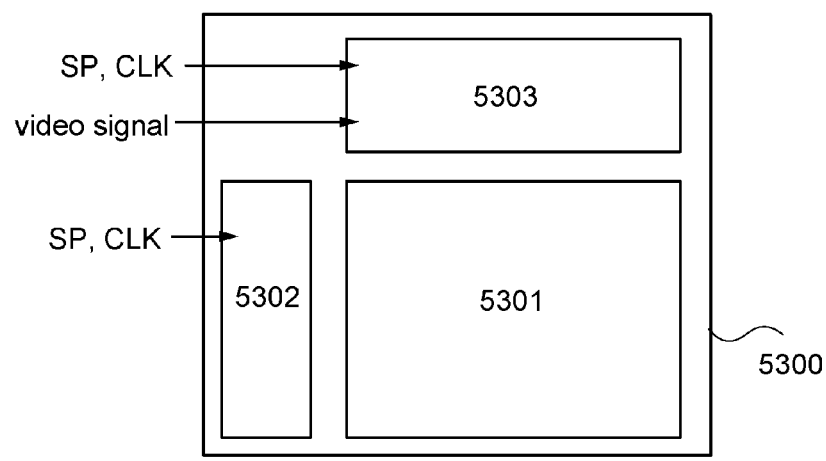
FIGS. 14A and 14B are block diagrams each illustrating a semiconductor device.

FIG. 14A illustrates an example of a block diagram of an active matrix liquid crystal display device, which is an example of a semiconductor device. The display device illustrated in FIG. 14A includes, over a substrate 5300, a pixel portion 5301 including a plurality of pixels that are each provided with a display element; a scan line driver circuit 5302 that selects a pixel; and a signal line driver circuit 5303 that controls a video signal input to the selected pixel.

The thin film transistor described in any of Embodiments 1 to 3 is an n-channel TFT, and a signal line driver circuit including an n-channel TFT is described with reference to FIG. 15.

Figure 15:
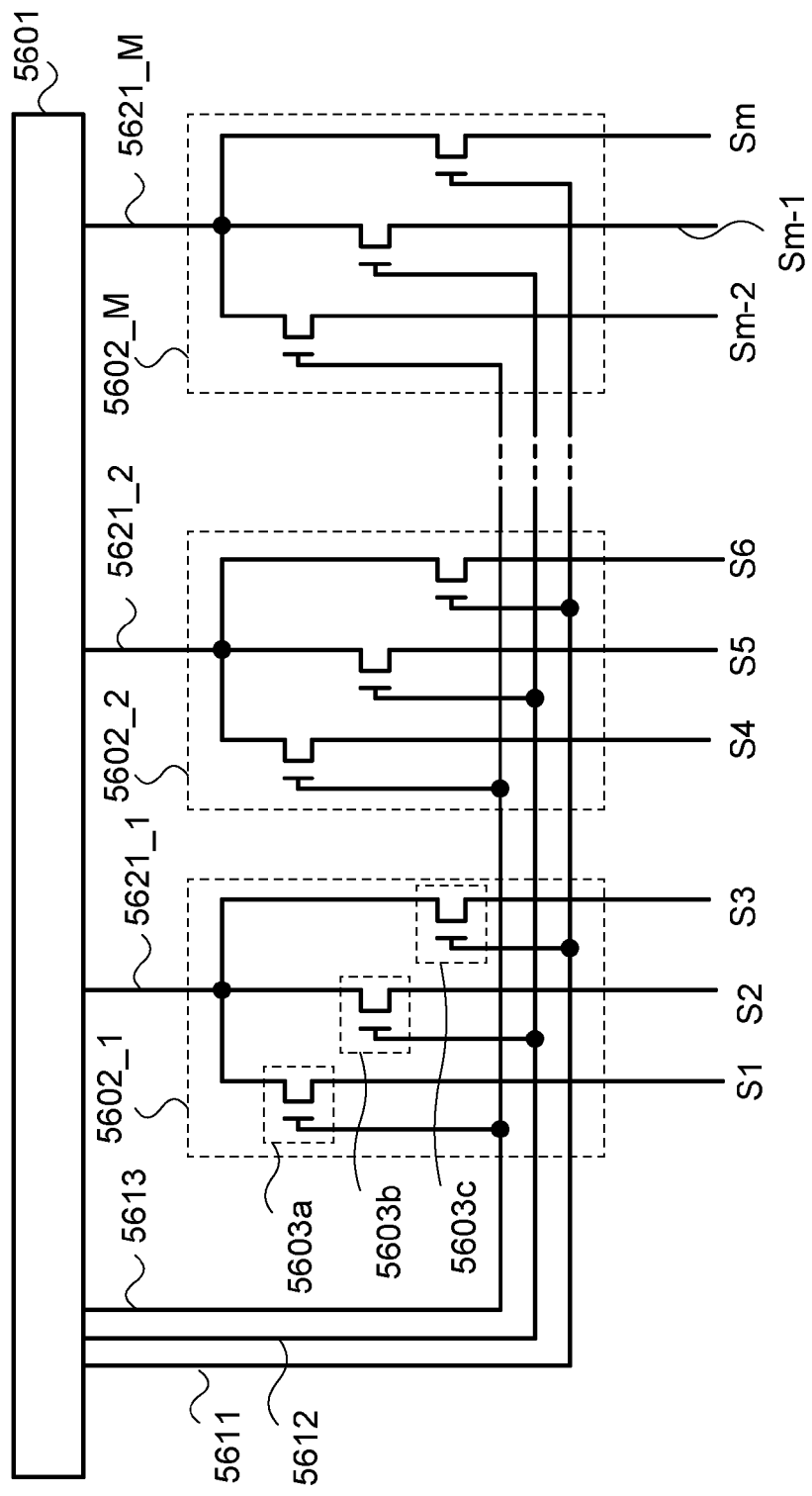
FIG. 15 illustrates a configuration of a signal line driver circuit.

The signal line driver circuit shown in FIG. 15 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, and the third wiring 5613, and the wirings 5621_1 to 5621_M are connected to the switch groups 5602_1 to 5602_M, respectively. Each of the wirings 5621_1 to 5621_M is connected to three signal lines via the first thin film transistor 5603a, the second thin film transistor 5603b, and the third thin film transistor 5603c. For example, the wiring 5621_J of the J-th column (one of the wirings 5621_1 to 5621_M) is connected to a signal line Sj−1, a signal line Sj, and a signal line Sj+1 via the first thin film transistor 5603a, the second thin film transistor 5603b, and the third thin film transistor 5603c, respectively, which are included in the switch group 5602_J.

A signal is input to each of the first wiring 5611, the second wiring 5612, and the third wiring 5613.

Note that the driver IC 5601 is preferably formed over a single crystal substrate. Further, the switch groups 5602_1 to 5602_M are preferably formed over the same substrate as the pixel portion. Therefore, the driver IC 5601 and the switch groups 5602_1 to 5602_M are preferably connected through an FPC or the like.

Figure 16:
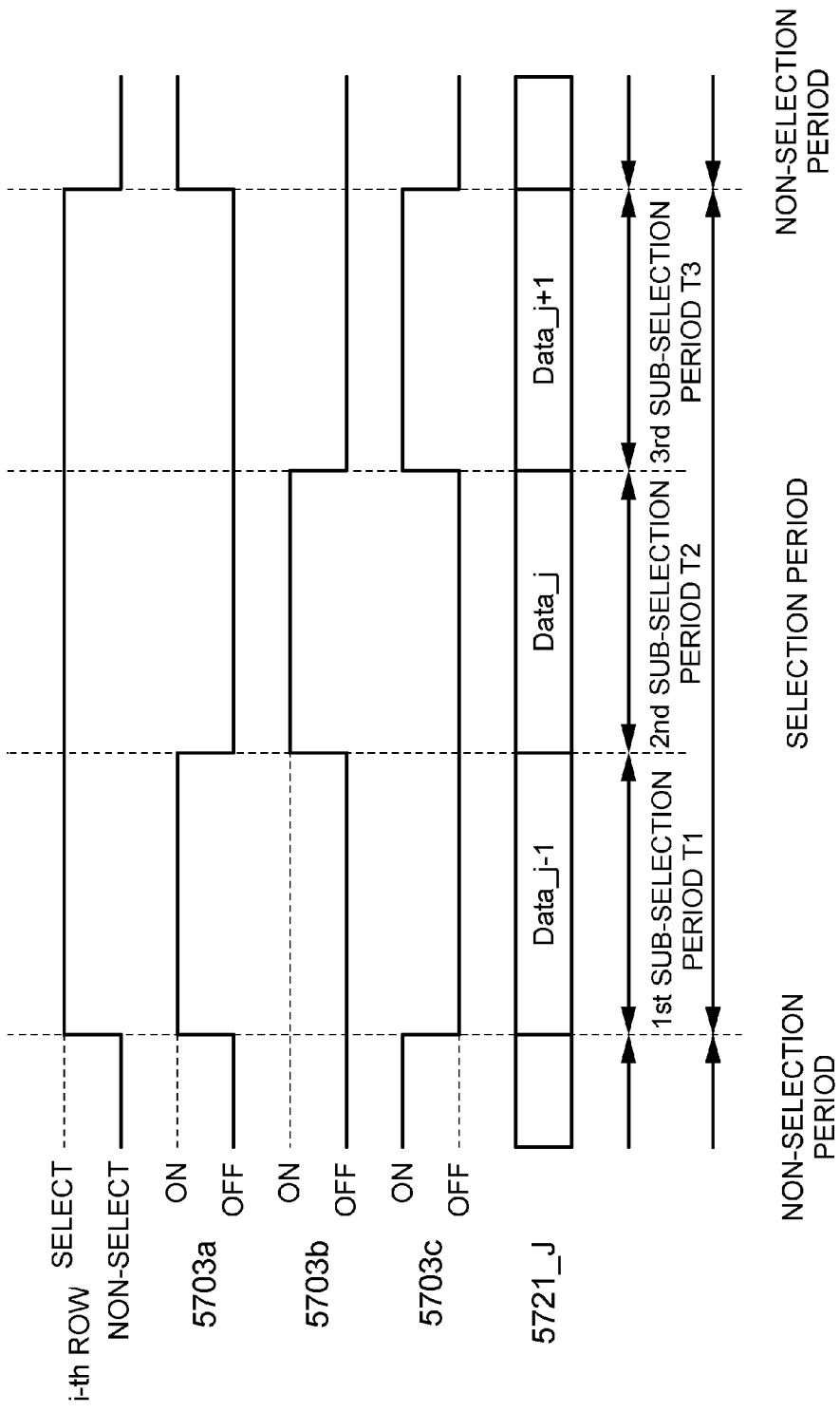
FIG. 16 is a timing chart illustrating operation of a signal line driver circuit.

Next, operation of the signal line driver circuit illustrated in FIG. 15 is described with reference to a timing chart in FIG. 16. The timing chart in FIG. 16 illustrates the case where the scan line Gi of the i-th row is selected. A selection period of the scan line Gi of the i-th row is divided into a first sub-selection period T1, a second sub-selection period T2, and a third sub-selection period T3. In addition, even when a scan line of another row is selected, the signal line driver circuit in FIG. 15 operates in a manner similar to that in FIG. 16.

Note that the timing chart in FIG. 16 shows the case where the wiring 5621_J of the J-th column is connected to the signal line Sj−1, the signal line Sj, and the signal line Sj+1 via the first thin film transistor 5603a, the second thin film transistor 5603b, and the third thin film transistor 5603c, respectively.

Note that the timing chart in FIG. 16 shows timing at which the scan line Gi of the i-th row is selected, timing 5703a of on/off of the first thin film transistor 5603a, timing 5703b of on/off of the second thin film transistor 5603b, timing 5703c of on/off of the third thin film transistor 5603c, and a signal 5721_J input to the wiring 5621_J of the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−1, a video signal input to the wiring 5621_J in the second sub-selection period T2 is input to the signal line Sj, and a video signal input to the wiring 5621_J in the third sub-selection period T3 is input to the signal line Sj+1. In addition, the video signals input to the wiring 5621_J in the first sub-selection period T1, the second sub-selection period T2, and the third sub-selection period T3 are denoted by Data_j−1, Data_j, and Data_j+1.

As shown in FIG. 16, in the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit in FIG. 15, by dividing one gate selection period into three, video signals can be input to three signal lines from one wiring 5621 in one gate selection period. Therefore, in the signal line driver circuit in FIG. 15, the number of connections between the substrate provided with the driver IC 5601 and the substrate provided with the pixel portion can be approximately ⅓ of the number of signal lines. The number of connections is reduced to approximately ⅓ of the number of the signal lines, so that reliability, yield, and the like of the signal line driver circuit in FIG. 15 can be improved.

Note that there are no particular limitation on the arrangement, the number, a driving method, and the like of the thin film transistors, as long as one gate selection period is divided into a plurality of sub-selection periods and video signals are input to a plurality of signal lines from one wiring in the respective sub-selection periods as shown in FIG. 15.

For example, when video signals are input to three or more signal lines from one wiring in three or more sub-selection periods, it is only necessary to add a thin film transistor and a wiring for controlling the thin film transistor. Note that when one gate selection period is divided into four or more sub-selection periods, one sub-selection period becomes shorter. Therefore, one gate selection period is preferably divided into two or three sub-selection periods.

Figure 17:
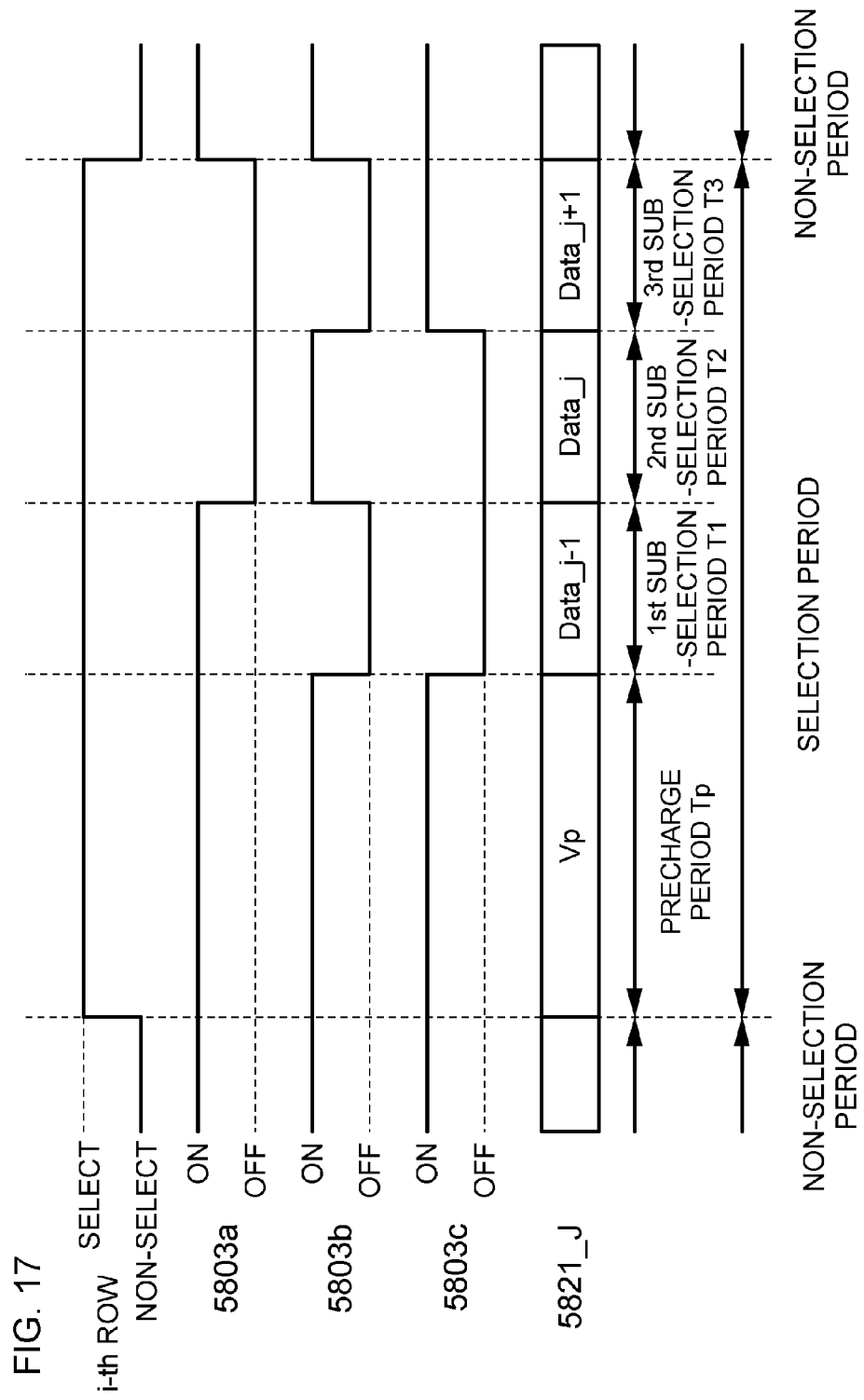
FIG. 17 is a timing chart illustrating operation of a signal line driver circuit.

As another example, one selection period may be divided into a precharge period Tp, the first sub-selection period T1, the second sub-selection period T2, and the third sub-selection period T3 as shown in a timing chart of FIG. 17. The timing chart of FIG. 17 shows the timing at which the scan line Gi of the i-th row is selected, timing 5803a of on/off of the first thin film transistor 5603a, timing 5803b of on/off of the second thin film transistor 5603b, timing 5803c of on/off of the third thin film transistor 5603c, and a signal 5821_J input to the wiring 5621_J of the J-th column. As shown in FIG. 17, the first thin film transistor 5603a, the second thin film transistor 5603b, and the third thin film transistor 5603c are tuned on in the precharge period Tp. At this time, precharge voltage Vp input to the wiring 5621_J is input to the signal line Sj−1, the signal line Sj, and the signal line Sj+1 via the first thin film transistor 5603a, the second thin film transistor 5603b, and the third thin film transistor 5603c, respectively. In the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit of FIG. 15 to which the timing chart of FIG. 17 is applied, the video signal can be written to the pixel at high speed because the signal line can be precharged by providing a precharge selection period before a sub-selection period. Note that portions of FIG. 17 which are similar to those of FIG. 16 are denoted by common reference numerals and detailed description of like portions and portions having similar functions is omitted.

Further, a structure of a scan line driver circuit is described. The scan line driver circuit includes a shift register and a buffer. Additionally, the scan line driver circuit may include a level shifter. In the scan line driver circuit, when a clock signal (CLK) and a start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line have to be turned on all at once, a buffer which can supply a large current is used.

One mode of a shift register used for part of the scan line driver circuit is described with reference to FIG. 18 and FIG. 19.

Figure 18:
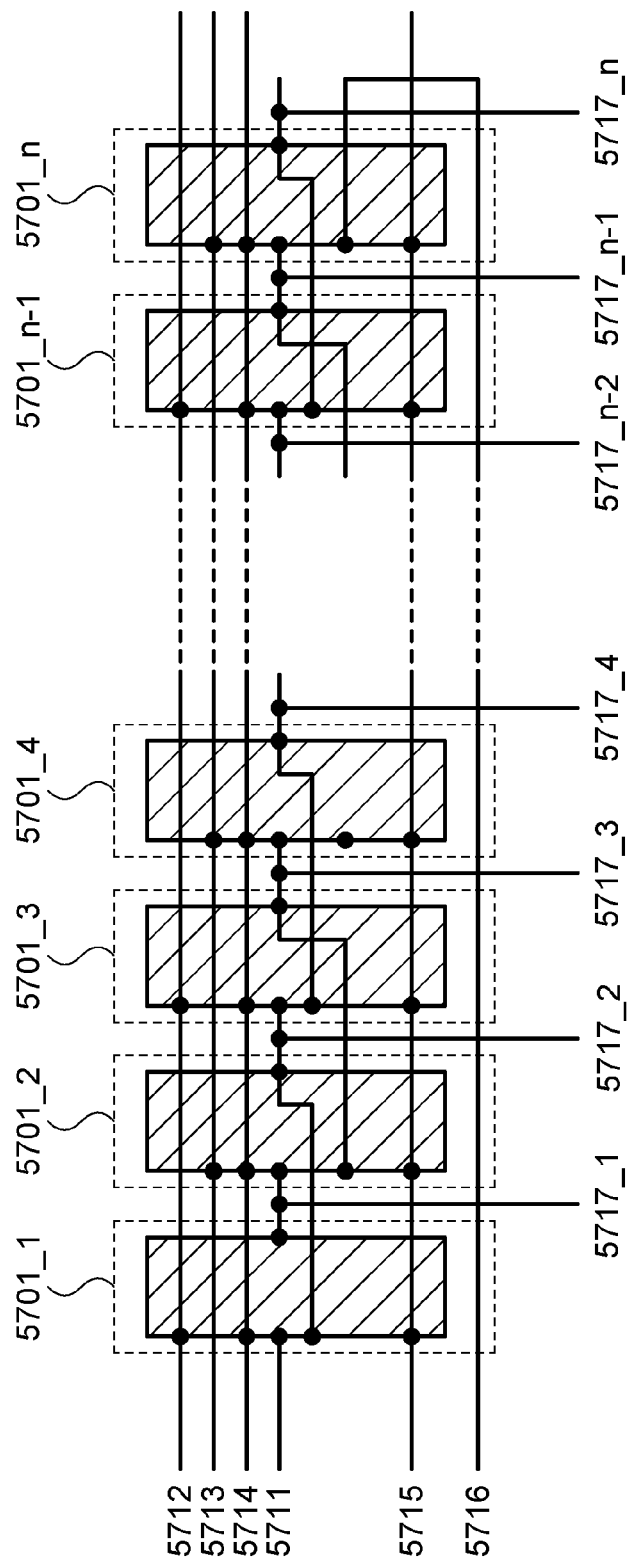
FIG. 18 illustrates a configuration of a shift register.

FIG. 18 illustrates a circuit structure of the shift register. The shift register illustrated in FIG. 18 includes a plurality of flip-flops: flip-flops 5701_1 to 5701_n. The shift register is operated with input of a first clock signal, a second clock signal, a start pulse signal, and a reset signal.

The connection relationship of the shift register of FIG. 18 is described. In the i-th stage flip-flop 5701_i (one of the flip-flops 5701_1 to 5701_n) in the shift register of FIG. 18, a first wiring 5501 shown in FIG. 19 is connected to a seventh wiring 5717_i−1, a second wiring 5502 shown in FIG. 19 is connected to a seventh wiring 5717_i+1, a third wiring 5503 shown in FIG. 19 is connected to a seventh wiring 5717_i, and a sixth wiring 5506 shown in FIG. 19 is connected to a fifth wiring 5715.

Figure 19:
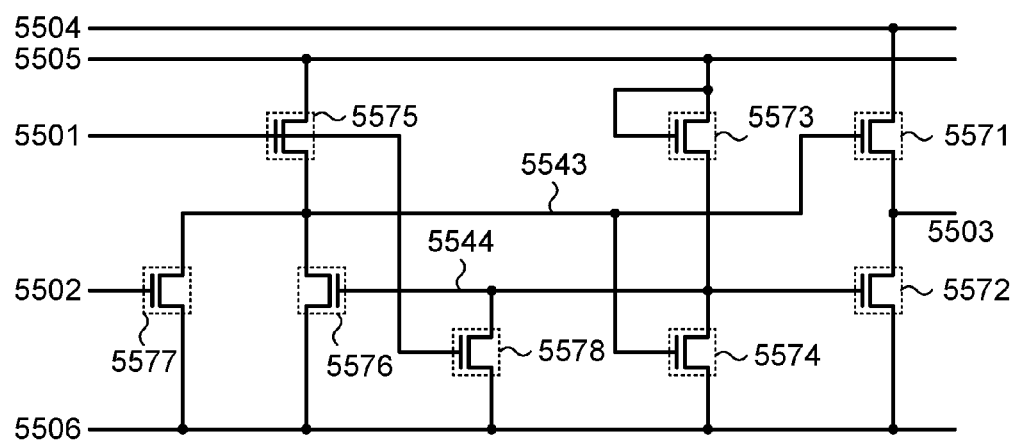
FIG. 19 illustrates a connection structure of flip-flops illustrated in FIG. 18.

Further, a fourth wiring 5504 illustrated in FIG. 19 is connected to a second wiring 5712 in flip-flops of odd-numbered stages, and is connected to a third wiring 5713 in flip-flops of even-numbered stages. A fifth wiring 5505 illustrated in FIG. 19 is connected to a fourth wiring 5714.

Note that the first wiring 5501 of the first stage flip-flop 5701_1 which is illustrated in FIG. 19 is connected to a first wiring 5711. Moreover, the second wiring 5502 of the n-th stage flip-flop 5701_n which is illustrated in FIG. 19 is connected to a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power source line and a second power source line, respectively.

Next, FIG. 19 illustrates details of the flip-flops illustrated in FIG. 18. A flip-flop illustrated in FIG. 19 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Note that the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 are n-channel transistors and are turned on when the gate-source voltage ($V_{gs}$) exceeds the threshold voltage ($V_{th}$).

Next, connection structures of the flip-flops illustrated in FIG. 18 are described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505. A second electrode of the third thin film transistor 5573 is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506. A second electrode of the fourth thin film transistor 5574 is connected to the gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502. A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that the point at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected is referred to as a node 5543. The point at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected is referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power source line and a second power source line, respectively.

Moreover, the signal line driver circuit and the scan line driver circuit can be manufactured using only the n-channel TFTs described in any of Embodiments 1 to 3. The n-channel TFT described in any of Embodiments 1 to 3 has a high mobility, and thus a driving frequency of a driver circuit can be increased. Further, in the case of the n-channel TFT described in any of Embodiments 1 to 3, since parasitic capacitance is reduced, frequency characteristics (also referred to as f characteristics) are excellent. For example, a scan line driver circuit using the n-channel TFT described in any of Embodiments 1 to 3 can operate at high speed, and thus a frame frequency can be increased and insertion of black images and the like can be realized.

In addition, when the channel width of the transistor in the scan line driver circuit is increased or a plurality of scan line driver circuits are provided, for example, higher frame frequency can be realized. When a plurality of scan line driver circuits are provided, a scan line driver circuit for driving scan lines of even-numbered rows is provided on one side and a scan line driver circuit for driving scan lines of odd-numbered rows is provided on the opposite side; thus, an increase in frame frequency can be realized. Furthermore, the use of the plurality of scan line driver circuits for output of signals to the same scan line is advantageous in increasing the size of a display device.

Figure 14B:
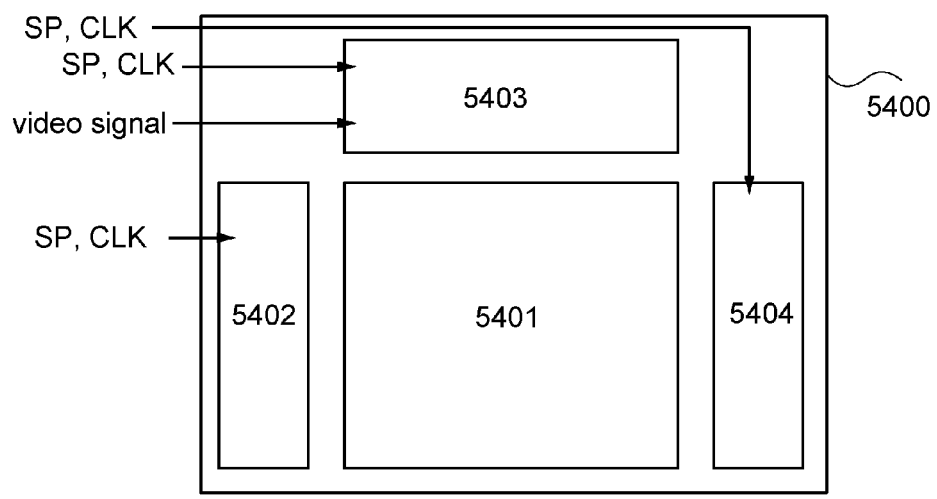

Further, when an active matrix light-emitting display device which is an example of a semiconductor device is manufactured, a plurality of thin film transistors are arranged in at least one pixel, and thus a plurality of scan line driver circuits are preferably arranged. FIG. 14B illustrates an example of a block diagram of an active matrix light-emitting display device.

The light-emitting display device illustrated in FIG. 14B includes, over a substrate 5400, a pixel portion 5401 including a plurality of pixels each provided with a display element, a first scan line driver circuit 5402 and a second scan line driver circuit 5404 for selecting a pixel, and a signal line driver circuit 5403 for controlling a video signal input to the selected pixel.

When the video signal input to a pixel of the light-emitting display device illustrated in FIG. 14B is a digital signal, a pixel emits light or does not emit light by switching a transistor on/off. Thus, grayscale can be displayed using an area grayscale method or a time grayscale method. An area grayscale method refers to a driving method in which one pixel is divided into a plurality of sub-pixels and each sub-pixel is driven independently based on a video signal so that grayscale is displayed. Further, a time grayscale method refers to a driving method in which a period during which a pixel emits light is controlled so that grayscale is displayed.

Since the response time of a light-emitting element is shorter than that of a liquid crystal element or the like, the light-emitting element is more suitable for a time grayscale method than the liquid crystal element. Specifically, in the case of displaying with a time grayscale method, one frame period is divided into a plurality of sub-frame periods. Then, in accordance with video signals, the light-emitting element in the pixel is brought into a light-emitting state or a non-light-emitting state in each sub-frame period. By dividing one frame period into a plurality of sub-frame periods, the total length of time, in which a pixel actually emits light in one frame period, can be controlled by video signals so that grayscale can be displayed.

Note that in the example of the light-emitting display device illustrated in FIG. 14B, when two switching TFTs are arranged in one pixel, the first scan line driver circuit 5402 generates a signal which is input to a first scan line serving as a gate wiring of one of the two switching TFTs, and the second scan line driver circuit 5404 generates a signal which is input to a second scan line serving as a gate wiring of the other of the two switching TFTs; however, one scan line driver circuit may generate both the signal which is input to the first scan line and the signal which is input to the second scan line. In addition, for example, there is a possibility that a plurality of scan lines used for controlling the operation of the switching element is provided in each pixel, depending on the number of the switching TFTs included in one pixel. In this case, one scan line driver circuit may generate all signals that are input to the plurality of scan lines, or a plurality of scan line driver circuits may generate signals that are input to the plurality of scan lines.

Also in the light-emitting display device, part of a driver circuit that can include an n-channel TFT among driver circuits can be formed over the same substrate as the thin film transistor in the pixel portion. Alternatively, the signal line driver circuit and the scan line driver circuit can be formed using only the n-channel TFTs described in any of Embodiments 1 to 3.

Moreover, the above-described driver circuit can be used for electronic paper in which electronic ink is driven by an element electrically connected to a switching element, without being limited to applications to a liquid crystal display device or a light-emitting display device. The electronic paper is also referred to as an electrophoretic display device (an electrophoretic display) and is advantageous in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, and each microcapsule contains first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high-electric field region. An electrophoretic display device does not need to use a polarizing plate which is required in a liquid crystal display device.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, when a plurality of the microcapsules are arranged as appropriate over an active matrix substrate so as to be interposed between two electrodes, an active matrix display device can be completed, and thus display can be performed by application of an electric field to the microcapsules. For example, the active matrix substrate obtained using the thin film transistor of any of Embodiments 1 to 3 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

Through the above steps, a highly reliable display device can be manufactured as a semiconductor device.

This embodiment can be implemented in appropriate combination with the structures described in the other embodiments.

Embodiment 5

When a thin film transistor is manufactured and used for a pixel portion and further for a driver circuit, a semiconductor device having a display function (also referred to as a display device) can be manufactured. Furthermore, when part or whole of a driver circuit using a thin film transistor is formed over the same substrate as a pixel portion, a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by current or voltage, and specifically include an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC or the like including a controller is mounted on the panel. The present invention also relates to an element substrate, which corresponds to one mode before the display element is completed in a manufacturing process of the display device, and the element substrate is provided with a means for supplying current to the display element in each of a plurality of pixels. Specifically, the element substrate may be in a state of being provided with only a pixel electrode of the display element, a state after a conductive film to be a pixel electrode is formed and before the conductive film is etched to form the pixel electrode, or any other states.

Note that a display device in this specification means an image display device, a display device, or a light source (including a lighting device). Further, the display device also includes the following modules in its category: a module to which a connector such as an FPC (flexible printed circuit), a TAB (tape automated bonding) tape, or a TCP (tape carrier package) is attached; a module having a TAB tape or a TCP at the tip of which a printed wiring board is provided; and a module in which an IC (integrated circuit) is directly mounted on a display element by a COG (chip on glass) method.

Figures 1, 10A:
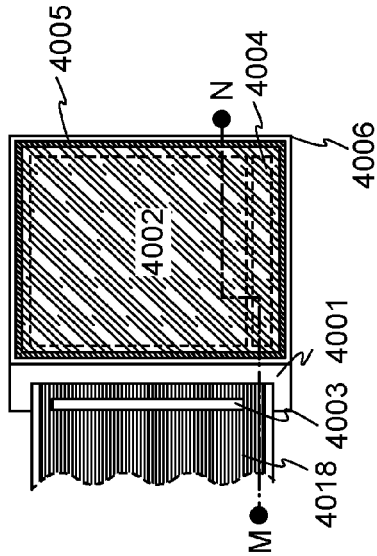
Figures 2, 10A:
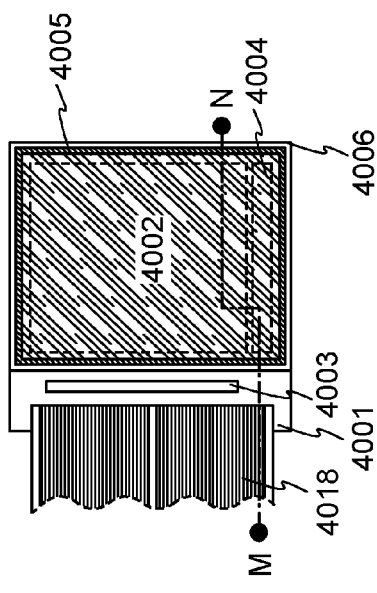
Figure 10B:
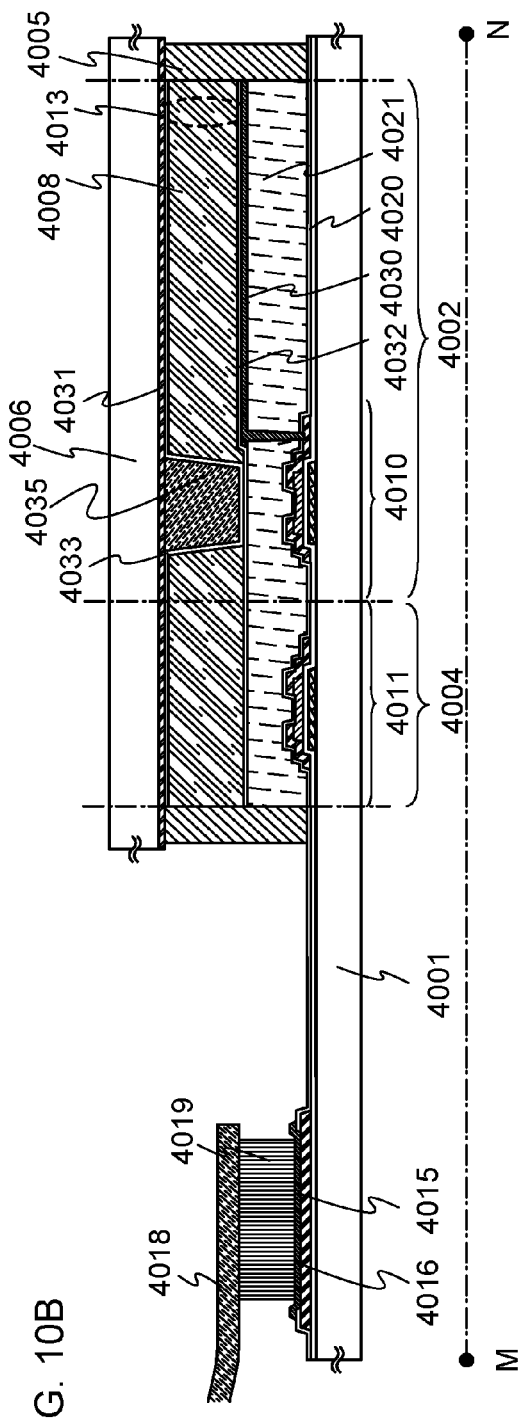

The appearance and a cross section of a liquid crystal display panel, which is one embodiment of a semiconductor device, are described with reference to FIGS. 10A-1, 10A-2, and 10B. FIGS. 10A-1 and 10A-2 are each a plan view of a panel in which highly reliable thin film transistors 4010 and 4011 each including the oxide semiconductor layer described in Embodiment 3, and a liquid crystal element 4013 are sealed between a first substrate 4001 and a second substrate 4006 with a sealant 4005. FIG. 10B is a cross-sectional view taken along line M-N in FIGS. 10A-1 and 10A-2.

The sealant 4005 is provided to surround a pixel portion 4002 and a scan line driver circuit 4004 that are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region different from the region surrounded by the sealant 4005 over the first substrate 4001.

Note that there is no particular limitation on the connection method of a driver circuit which is separately formed, and a COG method, a wire bonding method, a TAB method, or the like can be used. FIG. 10A-1 illustrates an example of mounting the signal line driver circuit 4003 by a COG method, and FIG. 10A-2 illustrates an example of mounting the signal line driver circuit 4003 by a TAB method.

Further, the pixel portion 4002 and the scan line driver circuit 4004, which are formed over the first substrate 4001, each include a plurality of thin film transistors. The thin film transistor 4010 included in the pixel portion 4002 and the thin film transistor 4011 included in the scan line driver circuit 4004 are illustrated in FIG. 10B. Insulating layers 4020 and 4021 are provided over the thin film transistors 4010 and 4011.

Any of the highly reliable thin film transistors including the oxide semiconductor layer which is described in Embodiment 3 can be used as the thin film transistors 4010 and 4011. Alternatively, the thin film transistor described in Embodiment 1 or 2 may be applied. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is provided for the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 which function as an alignment film, respectively, and hold the liquid crystal layer 4008 with the insulating layers 4032 and 4033 interposed therebetween.

Note that the first substrate 4001 and the second substrate 4006 can be formed using glass, metal (typically, stainless steel), ceramic, or plastic. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

Reference numeral 4035 denotes a columnar spacer obtained by selectively etching an insulating film and is provided to control the distance (a cell gap) between the pixel electrode layer 4030 and the counter electrode layer 4031. Alternatively, a spherical spacer may also be used. In addition, the counter electrode layer 4031 is electrically connected to a common potential line formed over the same substrate as the thin film transistor 4010. With use of a common connection portion, the counter electrode layer 4031 can be electrically connected to the common potential line through conductive particles provided between a pair of substrates. Note that the conductive particles are included in the sealant 4005.

Alternatively, a liquid crystal exhibiting a blue phase for which an alignment film is unnecessary may be used. A blue phase is one of liquid crystal phases, which appears just before a cholesteric phase changes into an isotropic phase while temperature of cholesteric liquid crystal is increased. Since the blue phase appears within an only narrow range of temperature, a liquid crystal composition containing a chiral agent at 5 wt % or more so as to improve the temperature range is used for the liquid crystal layer 4008. The liquid crystal composition which includes a liquid crystal showing a blue phase and a chiral agent has a short response time of 1 msec or less, has optical isotropy, which makes the alignment process unneeded, and has a small viewing angle dependence.

An embodiment of the present invention can also be applied to a reflective liquid crystal display device or a semi-transmissive liquid crystal display device, in addition to a transmissive liquid crystal display device.

An example of the liquid crystal display device is described in which a polarizing plate is provided on the outer surface of the substrate (on the viewer side) and a coloring layer and an electrode layer used for a display element are provided on the inner surface of the substrate; however, the polarizing plate may be provided on the inner surface of the substrate. The stack structure of the polarizing plate and the coloring layer is not limited to that described in this embodiment and may be set as appropriate depending on materials of the polarizing plate and the coloring layer or conditions of manufacturing steps. Furthermore, a light-blocking film functioning as a black matrix may be provided.

In order to reduce surface roughness of the thin film transistor and to improve reliability of the thin film transistor, the thin film transistor obtained in any of the above embodiments is covered with the insulating layers (the insulating layer 4020 and the insulating layer 4021) functioning as a protective film or a planarizing insulating film. Note that the protective film is provided to prevent entry of impurities contained in the air, such as an organic substance, a metal substance, or water vapor, and is preferably a dense film. The protective film may be formed by a sputtering method to be a single layer or a stacked layer using any of a silicon oxide film, a silicon nitride film, a silicon oxynitride film, a silicon nitride oxide film, an aluminum oxide film, an aluminum nitride film, an aluminum oxynitride film, and an aluminum nitride oxide film. Although an example in which the protective film is formed by a sputtering method is described in this embodiment, an embodiment of the present invention is not limited to this method and a variety of methods may be employed.

Here, the insulating layer 4020 having a stack structure is formed as the protective film. As a first layer of the insulating layer 4020, a silicon oxide film is formed by a sputtering method. The use of the silicon oxide film as the protective film has the effect of preventing a hillock of an aluminum film used for the source and drain electrode layers.

In addition, an insulating layer is formed as a second layer of the protective film. In this embodiment, as a second layer of the insulating layer 4020, a silicon nitride film is formed by a sputtering method. The use of the silicon nitride film as the protective film can prevent mobile ions such as sodium ions from entering a semiconductor region, thereby suppressing variations in electric characteristics of the TFT.

Further, heat treatment (at 300° C. or less) may be performed under a nitrogen atmosphere or an air atmosphere after formation of the protective film.

The insulating layer 4021 is formed as the planarizing insulating film. As the insulating layer 4021, an organic material having heat resistance such as polyimide, acrylic, benzocyclobutene, polyamide, or epoxy can be used. Other than such organic materials, it is also possible to use a low-dielectric constant material (low-k material), a siloxane-based resin, phosphosilicate glass (PSG), borophosphosilicate glass (BPSG), or the like. Note that the insulating layer 4021 may be formed by stacking a plurality of insulating films formed using these materials.

Note that the siloxane-based resin is a resin including a Si—O—Si bond formed using a siloxane-based material as a starting material. The siloxane-based resin may include an organic group (e.g., an alkyl group or an aryl group) or a fluoro group as a substituent. In addition, the organic group may include a fluoro group.

A formation method of the insulating layer 4021 is not particularly limited, and the following method can be employed depending on the material: a sputtering method, an SOG method, a spin coating method, a dipping method, a spray coating method, a droplet discharge method (e.g., an inkjet method, screen printing, or offset printing), a doctor knife, a roll coater, a curtain coater, a knife coater, or the like. The baking step of the insulating layer 4021 also serves as annealing of the semiconductor layer, whereby a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition including a conductive high molecule (also referred to as a conductive polymer) can be used for the pixel electrode layer 4030 and the counter electrode layer 4031. The pixel electrode formed using the conductive composition preferably has a sheet resistance of 10000 ohms per square or less and a transmittance of 70% or more at a wavelength of 550 nm. Further, the resistivity of the conductive high molecule included in the conductive composition is preferably 0.1 Ω·cm or less.

As the conductive high molecule, a so-called π-electron conjugated conductive polymer can be used. For example, it is possible to use polyaniline or a derivative thereof, polypyrrole or a derivative thereof, polythiophene or a derivative thereof, or a copolymer of two or more kinds of them.

In addition, a variety of signals and potentials are supplied to the signal line driver circuit 4003 that is formed separately, and the scan line driver circuit 4004 or the pixel portion 4002 from an FPC 4018.

A connection terminal electrode 4015 is formed using the same conductive film as the pixel electrode layer 4030 included in the liquid crystal element 4013 and a terminal electrode 4016 is formed using the same conductive film as the source and drain electrode layers included in the thin film transistors 4010 and 4011.

The connection terminal electrode 4015 is electrically connected to a terminal included in the FPC 4018 via an anisotropic conductive film 4019.

Note that FIGS. 10A-1, 10A-2, and 10B illustrate an example in which the signal line driver circuit 4003 is formed separately and mounted on the first substrate 4001; however, the present invention is not limited to this structure. The scan line driver circuit may be separately formed and then mounted, or only part of the signal line driver circuit or part of the scan line driver circuit may be separately formed and then mounted.

Figure 20:
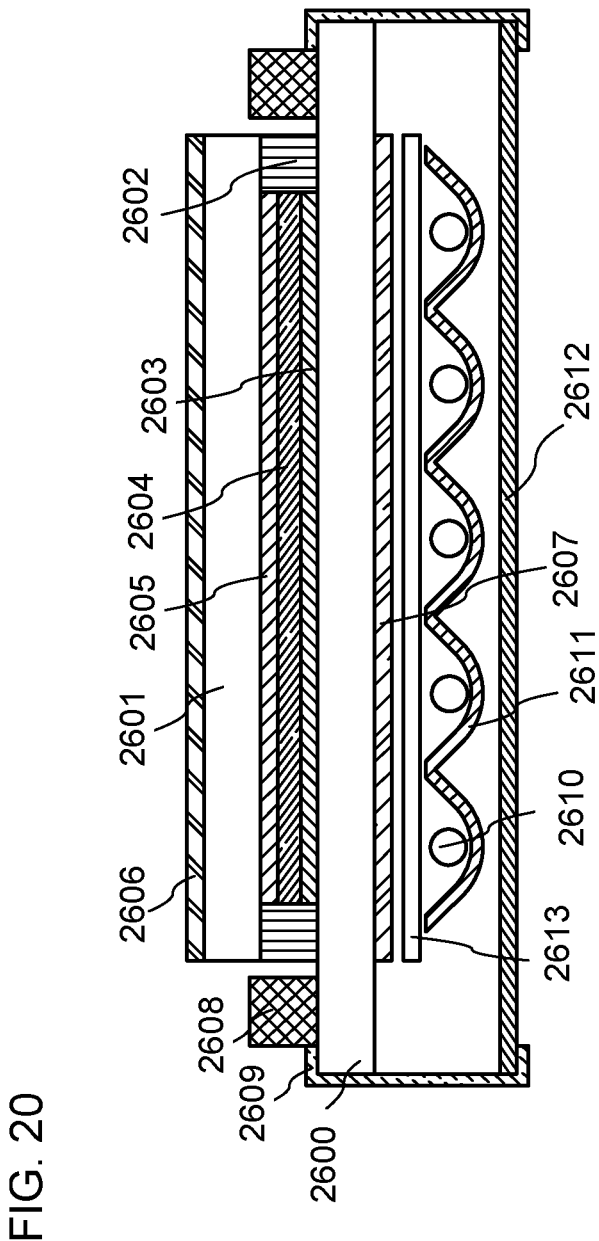
FIG. 20 illustrates a semiconductor device.

FIG. 20 illustrates an example of a liquid crystal display module which is formed as a semiconductor device by using a TFT substrate 2600 manufactured according to a manufacturing method disclosed in this specification.

FIG. 20 illustrates an example of a liquid crystal display module, in which a TFT substrate 2600 and a counter substrate 2601 are bonded to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Through the above process, a highly reliable liquid crystal display panel can be manufactured as a semiconductor device.

This embodiment can be implemented in appropriate combination with the structures described in the other embodiments.

Embodiment 6

An example of electronic paper is described as a semiconductor device.

The semiconductor device can be used for electronic paper in which electronic ink is driven by an element electrically connected to a switching element. The electronic paper is also referred to as an electrophoretic display device (an electrophoretic display) and is advantageous in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, and each microcapsule contains first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high-electric field region. An electrophoretic display device does not need to use a polarizing plate which is required in a liquid crystal display device.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, when a plurality of the microcapsules are arranged as appropriate over an active matrix substrate so as to be interposed between two electrodes, an active matrix display device can be completed, and thus display can be performed by application of an electric field to the microcapsules. For example, the active matrix substrate obtained using the thin film transistor of any of Embodiments 1 to 3 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

Figure 9:
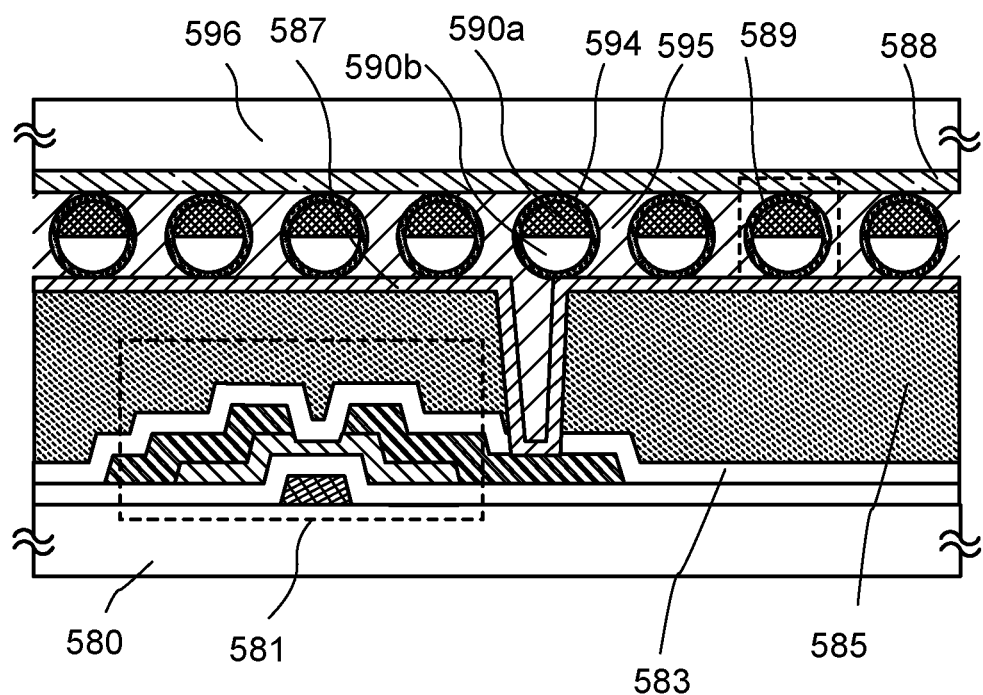
FIG. 9 illustrates a semiconductor device.

FIG. 9 illustrates active matrix electronic paper as an example of a semiconductor device. A thin film transistor 581 used for the semiconductor device can be formed in a manner similar to the thin film transistor described in Embodiment 1, which is a highly reliable thin film transistor including an oxide semiconductor layer. Any of the thin film transistors described in Embodiments 2 and 3 can also be used as the thin film transistor 581 of this embodiment.

The electronic paper illustrated in FIG. 9 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 sealed between a substrate 580 and a substrate 596 is a bottom gate thin film transistor and is covered with an insulating film 583 which is in contact with a semiconductor layer. A source electrode layer or a drain electrode layer of the thin film transistor 581 is in contact with a first electrode layer 587 in an opening formed in an insulating layer 585, whereby the thin film transistor 581 is electrically connected to the first electrode layer 587. Between the first electrode layer 587 and a second electrode layer 588, spherical particles 589 each having a black region 590a, a white region 590b, and a cavity 594 around the regions which is filled with liquid are provided. A space around the spherical particles 589 is filled with a filler 595 such as a resin (see FIG. 9). The first electrode layer 587 corresponds to a pixel electrode and the second electrode layer 588 corresponds to a common electrode. The second electrode layer 588 is electrically connected to a common potential line provided over the same substrate as the thin film transistor 581. With use of a common connection portion, the second electrode layer 588 can be electrically connected to the common potential line through conductive particles provided between a pair of substrates.

Instead of the twisting ball, an electrophoretic element can also be used. A microcapsule having a diameter of approximately 10 μm to 200 μm, in which a transparent liquid and positively charged white microparticles and negatively charged black microparticles are encapsulated, is used. In the microcapsule which is provided between the first electrode layer and the second electrode layer, when an electric field is applied by the first electrode layer and the second electrode layer, the white microparticles and the black microparticles migrate to opposite sides to each other, so that white or black can be displayed. A display element using this principle is an electrophoretic display element and is generally called electronic paper. The electrophoretic display element has higher reflectance than a liquid crystal display element, and thus an auxiliary light is unnecessary, power consumption is low, and a display portion can be recognized in a dim place. In addition, even when power is not supplied to the display portion, an image which has been displayed once can be maintained. Accordingly, a displayed image can be stored even when a semiconductor device having a display function (which may be referred to simply as a display device or a semiconductor device provided with a display device) is distanced from an electric wave source.

Through this process, a highly reliable electronic paper as a semiconductor device can be manufactured.

This embodiment can be implemented in appropriate combination with the structures described in the other embodiments.

Embodiment 7

An example of a light-emitting display device will be described as a semiconductor device. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In the organic EL element, by application of a voltage to a light-emitting element, electrons and holes are separately injected from a pair of electrodes into a layer containing a light-emitting organic compound, and thus current flows. Then, the carriers (electrons and holes) recombine, so that the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission which utilizes a donor level and an acceptor level. The thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 12:
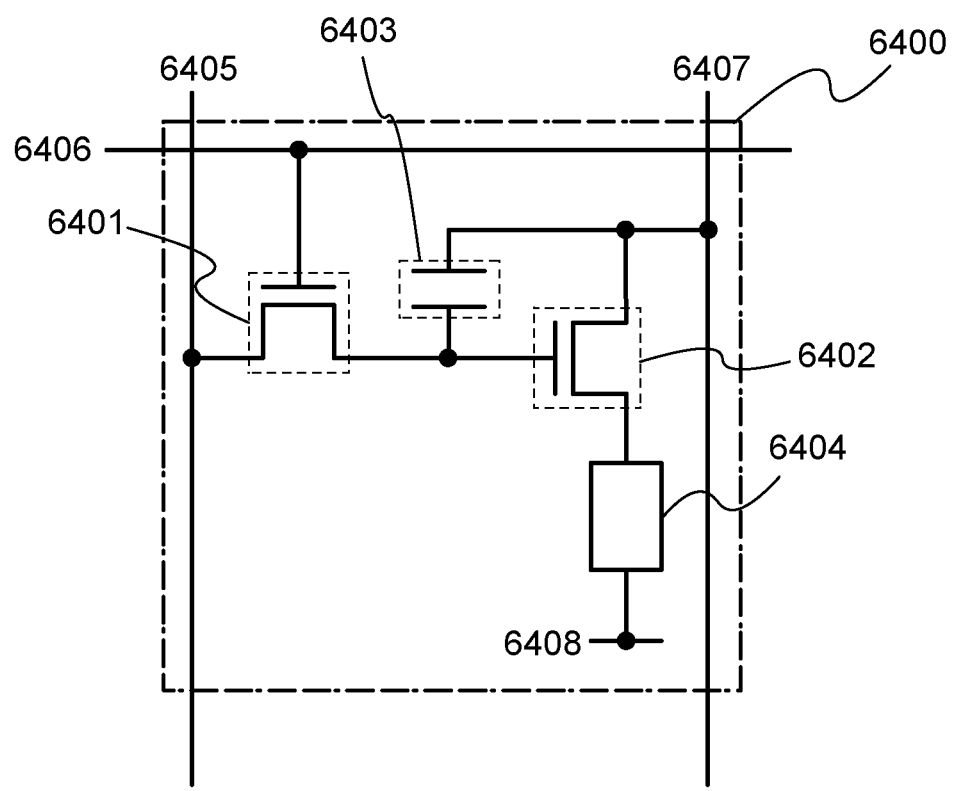
FIG. 12 illustrates a pixel equivalent circuit of a semiconductor device.

FIG. 12 illustrates an example of a pixel structure as an example of a semiconductor device which can be driven by a digital time grayscale method.

The structure and operation of a pixel which can be driven by a digital time grayscale method will be described. An example is described here in which one pixel includes two n-channel transistors each using an oxide semiconductor layer for a channel formation region.

A pixel 6400 includes a switching transistor 6401, a driving transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driving transistor 6402. The gate of the driving transistor 6402 is connected to a power source line 6407 through the capacitor 6403, a first electrode of the driving transistor 6402 is connected to the power source line 6407, and a second electrode of the driving transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

Note that the second electrode (common electrode 6408) of the light-emitting element 6404 is set to a low power source potential. The low power source potential is lower than a high power source potential which is supplied to the power source line 6407. For example, GND, 0 V, or the like may be set as the low power source potential. The difference between the high power source potential and the low power source potential is applied to the light-emitting element 6404 so that current flows through the light-emitting element 6404, whereby the light-emitting element 6404 emits light. Thus, each potential is set so that the difference between the high power source potential and the low power source potential is greater than or equal to a forward threshold voltage of the light-emitting element 6404.

When the gate capacitance of the driving transistor 6402 is used as a substitute for the capacitor 6403, the capacitor 6403 can be omitted. The gate capacitance of the driving transistor 6402 may be formed between a channel region and a gate electrode.

Here, in the case of using a voltage-input voltage-driving method, a video signal is input to the gate of the driving transistor 6402 to make the driving transistor 6402 completely turned on or off. That is, the driving transistor 6402 operates in a linear region, and thus, a voltage higher than the voltage of the power source line 6407 is applied to the gate of the driving transistor 6402. Note that a voltage greater than or equal to (power source line voltage+$V_{th}$ of the driving transistor 6402) is applied to the signal line 6405.

In the case of using an analog grayscale method instead of the digital time grayscale method, the same pixel structure as in FIG. 12 can be employed by inputting signals in a different way.

In the case of using the analog grayscale driving method, a voltage greater than or equal to (forward voltage of the light-emitting element 6404+$V_{th}$ of the driving transistor 6402) is applied to the gate of the driving transistor 6402. The forward voltage of the light-emitting element 6404 refers to a voltage to obtain a desired luminance, and includes at least a forward threshold voltage. By inputting a video signal to enable the driving transistor 6402 to operate in a saturation region, current can flow through the light-emitting element 6404. In order that the driving transistor 6402 can operate in the saturation region, the potential of the power source line 6407 is higher than a gate potential of the driving transistor 6402. With the analog video signal, current in accordance with the video signal flows through the light-emitting element 6404, and the analog grayscale driving method can be performed.

Note that the pixel structure is not limited to that illustrated in FIG. 12. For example, the pixel in FIG. 12 can further include a switch, a resistor, a capacitor, a transistor, a logic circuit, or the like.

Next, structures of the light-emitting element are described with reference to FIGS. 13A to 13C. Here, a cross-sectional structure of a pixel is described by taking an n-channel driving TFT as an example. Driving TFTs 7001, 7011, and 7021 used in semiconductor devices illustrated in FIGS. 13A, 13B, and 13C, respectively, can be formed in a manner similar to that of the thin film transistor described in Embodiment 1 and are highly reliable thin film transistors each including an oxide semiconductor layer. Alternatively, the thin film transistors described in Embodiment 2 or 3 can be used as the TFTs 7001, 7011, and 7021.

In order to extract light emitted from the light-emitting element, at least one of an anode and a cathode is required to transmit light. A thin film transistor and a light-emitting element are formed over a substrate. A light-emitting element can have a top emission structure in which light is extracted through the surface opposite to the substrate, a bottom emission structure in which light is extracted through the surface on the substrate side, or a dual emission structure in which light is extracted through the surface opposite to the substrate and the surface on the substrate side. The pixel structure can be applied to a light-emitting element having any of these emission structures.

A light-emitting element having a top emission structure is described with reference to FIG. 13A.

Figure 13A:
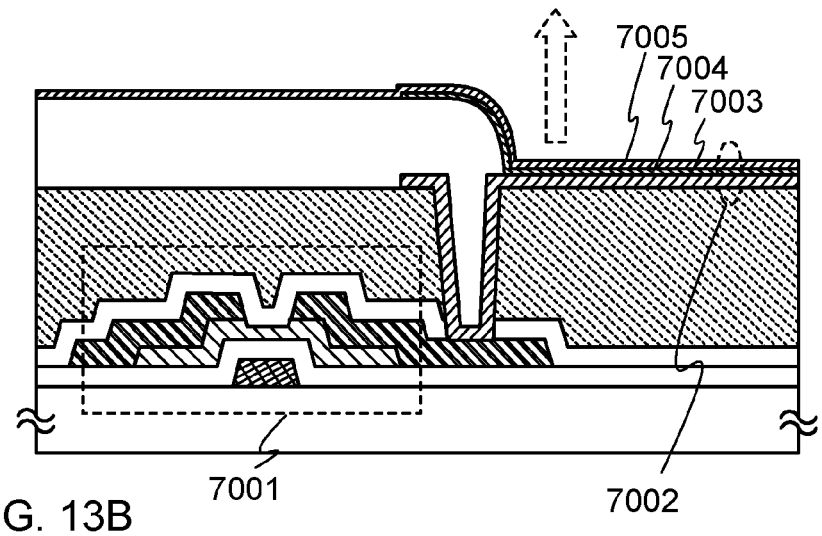
FIGS. 13A to 13C illustrate semiconductor devices.

FIG. 13A is a cross-sectional view of a pixel in the case where the driving TFT 7001 is an n-type TFT and light is emitted from a light-emitting element 7002 to an anode 7005 side. In FIG. 13A, a cathode 7003 of the light-emitting element 7002 is electrically connected to the TFT 7001 serving as a driving TFT, and a light-emitting layer 7004 and the anode 7005 are stacked in this order over the cathode 7003. The cathode 7003 can be formed using a variety of conductive materials as long as they have a low work function and reflect light. For example, Ca, Al, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injection layer, an electron-transport layer, a light-emitting layer, a hole-transport layer, and a hole-injection layer in this order over the cathode 7003. However, it is not necessary to form all of these layers. The anode 7005 is formed using a light-transmitting conductive film such as a film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The light-emitting element 7002 corresponds to a region where the light-emitting layer 7004 is sandwiched between the cathode 7003 and the anode 7005. In the case of the pixel illustrated in FIG. 13A, light is emitted from the light-emitting element 7002 to the anode 7005 side as indicated by an arrow.

Next, a light-emitting element having a bottom emission structure is described with reference to FIG. 13B. FIG. 13B is a cross-sectional view of a pixel in the case where the driving TFT 7011 is an n-type TFT and light is emitted from a light-emitting element 7012 to a cathode 7013 side. In FIG. 13B, the cathode 7013 of the light-emitting element 7012 is formed over a light-transmitting conductive film 7017 which is electrically connected to the driving TFT 7011, and a light-emitting layer 7014 and an anode 7015 are stacked in this order over the cathode 7013. A light-blocking film 7016 for reflecting or blocking light may be formed so as to cover the anode 7015 when the anode 7015 has a light-transmitting property. For the cathode 7013, various materials can be used as in the case of FIG. 13A as long as the cathode 7013 is formed using a conductive material having a low work function. The cathode 7013 is formed to have a thickness that enables transmission of light (preferably, approximately 5 nm to 30 nm). For example, an aluminum film with a thickness of 20 nm can be used as the cathode 7013. Similar to the case of FIG. 13A, the light-emitting layer 7014 may be formed using either a single layer or a plurality of layers stacked. The anode 7015 is not required to transmit light, but can be formed using a light-transmitting conductive material as in the case of FIG. 13A. As the light-blocking film 7016, a metal or the like that reflects light can be used, for example; however, it is not limited to a metal film. For example, a resin or the like to which black pigments are added can also be used.

A region where the light-emitting layer 7014 is sandwiched between the cathode 7013 and the anode 7015 corresponds to the light-emitting element 7012. In the case of the pixel illustrated in FIG. 13B, light is emitted from the light-emitting element 7012 to the cathode 7013 side as indicated by an arrow.

Next, a light-emitting element having a dual emission structure is described with reference to FIG. 13C. In FIG. 13C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. As in the case of FIG. 13A, the cathode 7023 can be formed using any of a variety of materials as long as the cathode 7023 is formed using a conductive material having a low work function. The cathode 7023 is formed to have a thickness that enables transmission of light. For example, an Al film having a thickness of 20 nm can be used as the cathode 7023. The light-emitting layer 7024 may be formed using a single layer or a plurality of layers stacked as in the case of FIG. 13A. As in the case of FIG. 13A, the anode 7025 can be formed using a light-transmitting conductive material.

The light-emitting element 7022 corresponds to a region where the cathode 7023, the light-emitting layer 7024, and the anode 7025 overlap with one another. In the case of the pixel illustrated in FIG. 13C, light is emitted from the light-emitting element 7022 to both the anode 7025 side and the cathode 7023 side as indicated by arrows.

Although an organic EL element is described here as a light-emitting element, an inorganic EL element can also be provided as a light-emitting element.

Note that the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 13B:
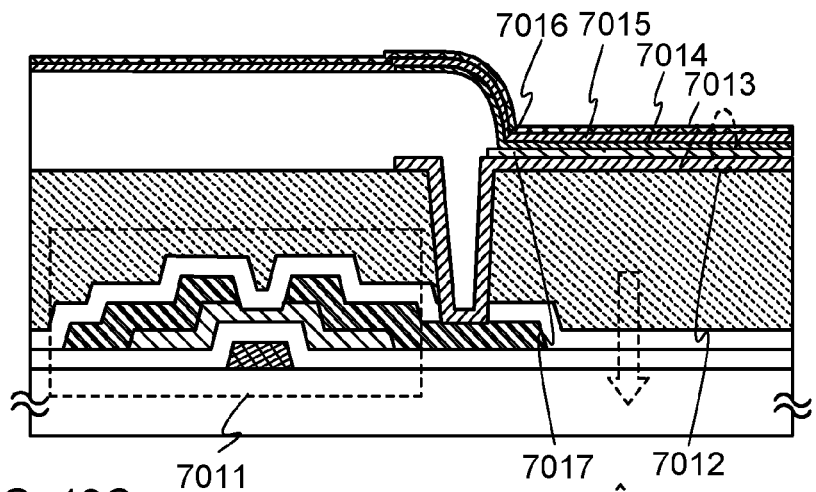
Figure 13C:
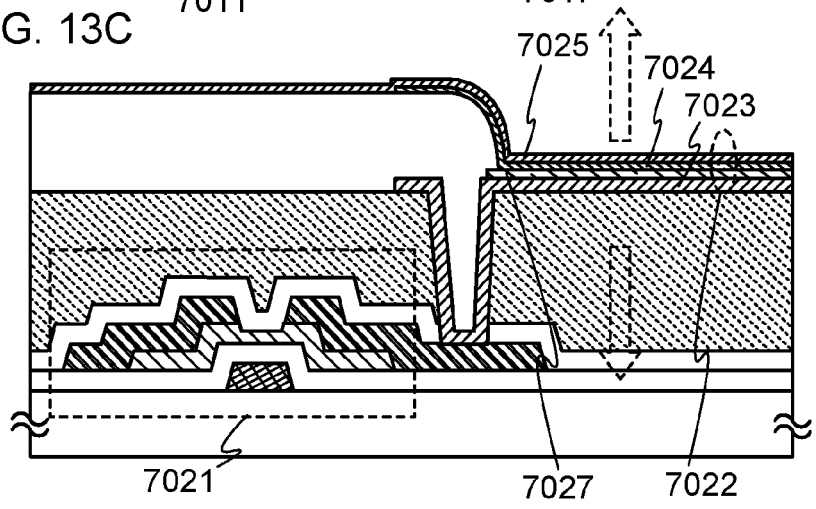

Note that the structure of the semiconductor device is not limited to those illustrated in FIGS. 13A to 13C and can be modified in various ways based on techniques disclosed in this specification.

Next, the appearance and a cross section of a light-emitting display panel (also referred to as a light-emitting panel), which is one embodiment of the semiconductor device, are described with reference to FIGS. 11A and 11B. FIG. 11A is a top view of a panel in which a thin film transistor and a light-emitting element formed over a first substrate are sealed between the first substrate and a second substrate with a sealant. FIG. 11B is a cross-sectional view taken along line H-I of FIG. 11A.

A sealant 4505 is provided to surround a pixel portion 4502, signal line driver circuits 4503a and 4503b, and scan line driver circuits 4504a and 4504b, which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a display device be thus packaged (sealed) with a protective film (such as a bonding film or an ultraviolet curable resin film) or a cover material with high air-tightness and little degasification so that the display device is not exposed to the outside air.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 11B.

For the thin film transistors 4509 and 4510, the highly reliable thin film transistor including the oxide semiconductor layer described in Embodiment 3 can be employed. Alternatively, the thin film transistor described in Embodiment 1 or 2 may be applied. The thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that the structure of the light-emitting element 4511 is the stack structure which includes the first electrode layer 4517, an electroluminescent layer 4512, and a second electrode layer 4513; however, there is no limitation. The structure of the light-emitting element 4511 can be changed as appropriate depending on the direction in which light is extracted from the light-emitting element 4511, or the like.

A partition wall 4520 is formed using an organic resin film, an inorganic insulating film, or organic polysiloxane. It is particularly preferable that the partition wall 4520 be formed using a photosensitive material and an opening be formed over the first electrode layer 4517 so that a sidewall of the opening is formed as an inclined surface with continuous curvature.

The electroluminescent layer 4512 may be formed using a single layer or a plurality of layers stacked.

A protective film may be formed over the second electrode layer 4513 and the partition wall 4520 in order to prevent oxygen, hydrogen, moisture, carbon dioxide, or the like from entering the light-emitting element 4511. As the protective film, a silicon nitride film, a silicon nitride oxide film, a DLC film, or the like can be formed.

A variety of signals and potentials are supplied to the signal line driver circuits 4503a and 4503b, the scan line driver circuits 4504a and 4504b or the pixel portion 4502 from FPCs 4518a and 4518b.

A connection terminal electrode 4515 is formed using the same conductive film as the first electrode layer 4517 included in the light-emitting element 4511, and a terminal electrode 4516 is formed using the same conductive film as the source and drain electrode layers included in the thin film transistors 4509 and 4510.

The connection terminal electrode 4515 is electrically connected to a terminal of the FPC 4518a through an anisotropic conductive film 4519.

The second substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scan line driver circuits 4504a and 4504b may be mounted as driver circuits formed using a single crystal semiconductor film or a polycrystalline semiconductor film over a substrate separately prepared. Alternatively, only the signal line driver circuits or part thereof, or only the scan line driver circuits or part thereof may be separately formed and mounted. This embodiment is not limited to the structure illustrated in FIGS. 11A and 11B.

Through the above steps, a highly reliable light-emitting display device (display panel) can be manufactured as a semiconductor device.

This embodiment can be implemented in appropriate combination with the structures described in the other embodiments.

Embodiment 8

A semiconductor device disclosed in this specification can be applied to electronic paper. Electronic paper can be used for electronic appliances of a variety of fields as long as they display data. For example, electronic paper can be applied to an electronic book device (electronic book), a poster, an advertisement in a vehicle such as a train, or displays of various cards such as a credit card. Examples of the electronic appliances are illustrated in FIGS. 21A and 21B and FIG. 22.

Figure 21A:
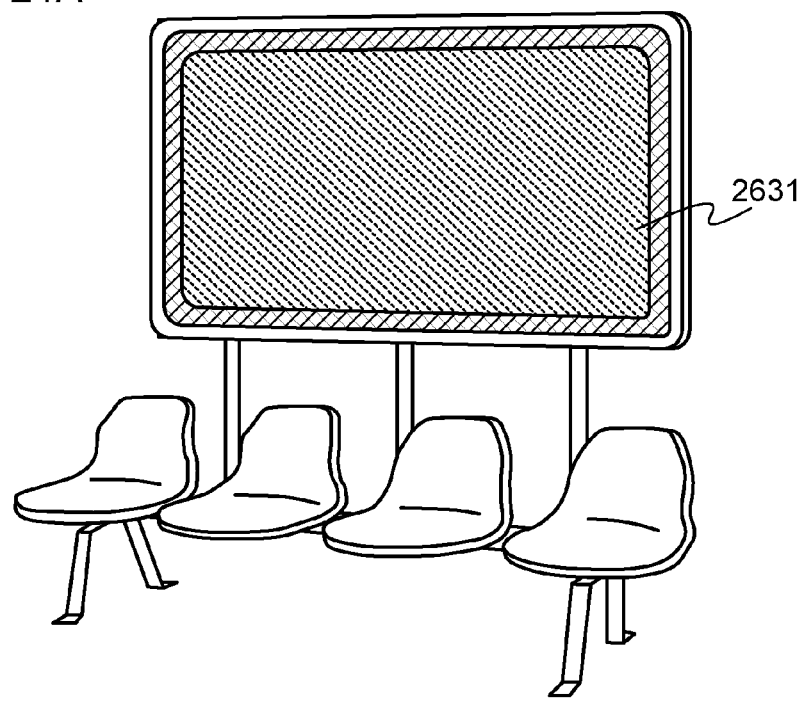
FIGS. 21A and 21B are drawings illustrating examples of application of electronic paper.

FIG. 21A illustrates a poster 2631 using electronic paper. In the case where an advertising medium is printed paper, the advertisement is replaced by hands; however, by using electronic paper disclosed in this specification, the advertising display can be changed in a short time. Furthermore, stable images can be obtained without display defects. Note that the poster may have a configuration capable of wirelessly transmitting and receiving data.

Figure 21B:
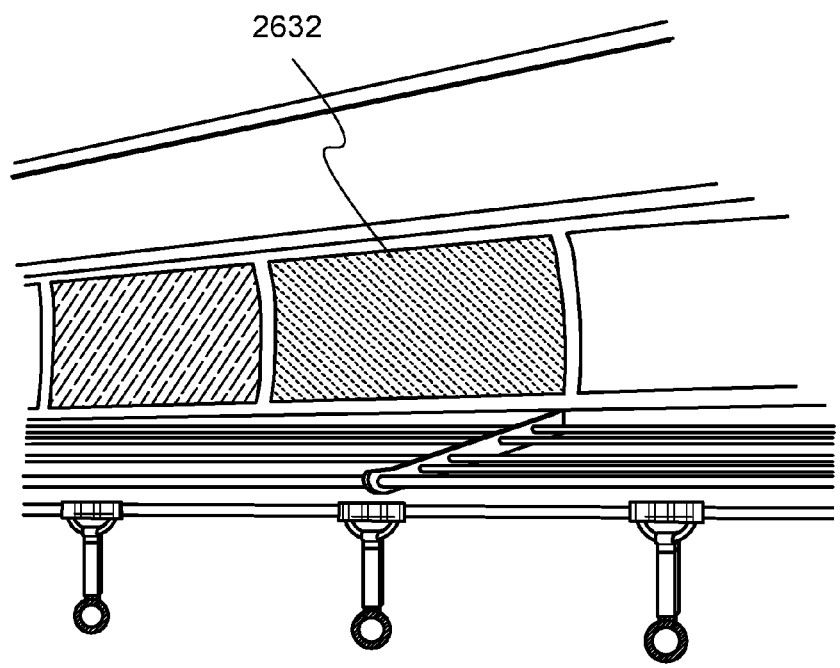

FIG. 21B illustrates an advertisement 2632 in a vehicle such as a train. In the case where an advertising medium is printed paper, the advertisement is replaced by hands; however, by using electronic paper disclosed in this specification, the advertising display can be changed in a short time with less manpower. Furthermore, stable images can be obtained without display defects. Note that the advertisement in a vehicle may have a configuration capable of wirelessly transmitting and receiving data.

Figure 22:
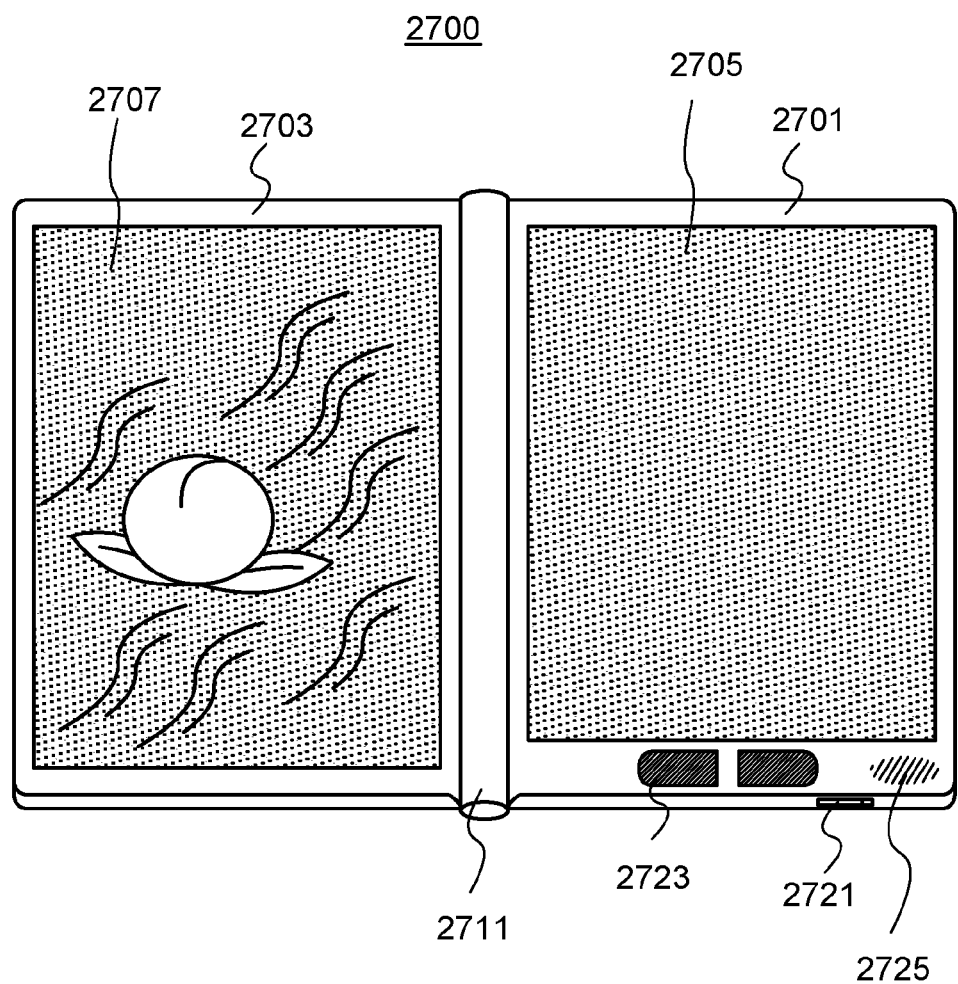
FIG. 22 is an external view illustrating an example of an e-book reader.

FIG. 22 illustrates an example of an electronic book device 2700. For example, the electronic book device 2700 includes two housings, a housing 2701 and a housing 2703. The housing 2701 and the housing 2703 are combined with a hinge 2711 so that the electronic book device 2700 can be opened and closed with the hinge 2711 as an axis. With such a structure, the electronic book device 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 22) and graphics can be displayed on a display portion on the left side (the display portion 2707 in FIG. 22).

FIG. 22 illustrates an example in which the housing 2701 is provided with an operation portion and the like. For example, the housing 2701 is provided with a power switch 2721, an operation key 2723, a speaker 2725, and the like. With the operation key 2723, pages can be turned. A keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the electronic book device 2700 may have a function of an electronic dictionary.

The electronic book device 2700 may have a configuration capable of wirelessly transmitting and receiving data. Through wireless communication, desired book data or the like can be purchased and downloaded from an electronic book server.

Embodiment 9

A semiconductor device disclosed in this specification can be applied to a variety of electronic appliances (including amusement machines). Examples of electronic appliances include a television set (also referred to as a television or a television receiver), a monitor of a computer or the like, a camera such as a digital camera or a digital video camera, a digital photo frame, a cellular phone (also referred to as a mobile phone or a mobile phone set), a portable game console, a portable information terminal, an audio reproducing device, a large-sized game machine such as a pachinko machine, and the like.

Figure 23A:
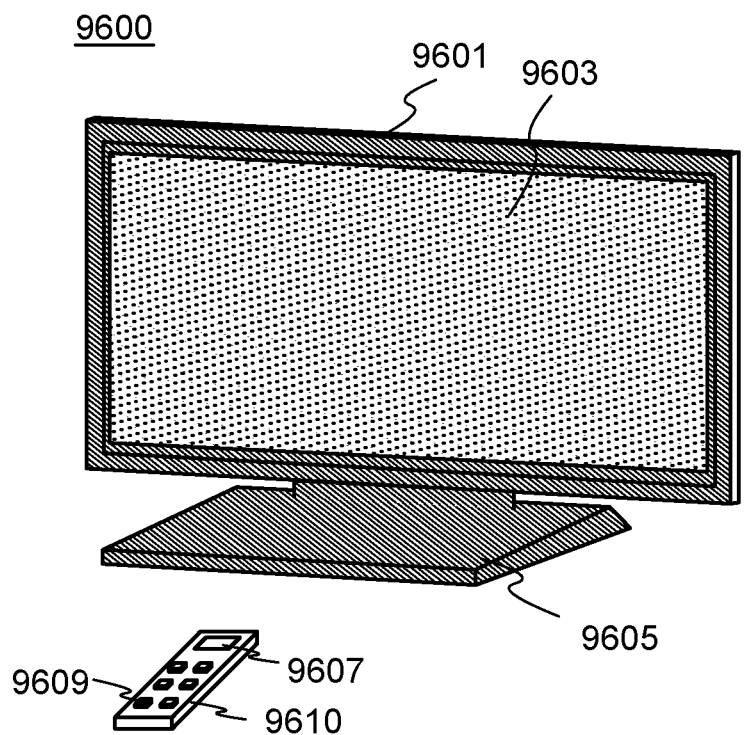
FIGS. 23A and 23B are external views illustrating examples of a television device and a digital photo frame.

FIG. 23A illustrates an example of a television set 9600. In the television set 9600, a display portion 9603 is incorporated in a housing 9601. Images can be displayed on the display portion 9603. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Figure 23B:
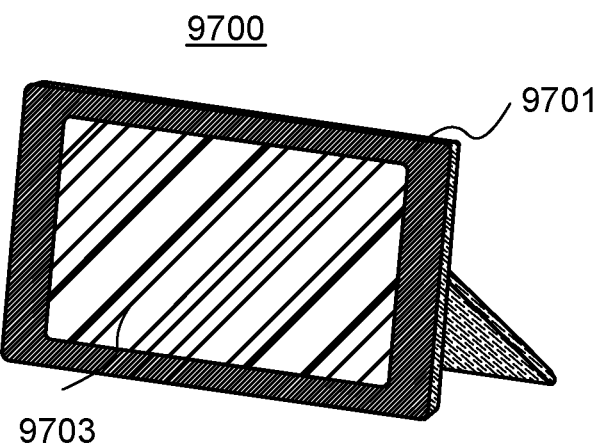

FIG. 23B illustrates an example of a digital photo frame 9700. For example, in the digital photo frame 9700, a display portion 9703 is incorporated in a housing 9701. Various images can be displayed on the display portion 9703. For example, the display portion 9703 can display data of an image shot by a digital camera or the like to function as a normal photo frame.

Note that the digital photo frame 9700 is provided with an operation portion, an external connection terminal (a USB terminal, a terminal that can be connected to various cables such as a USB cable, or the like), a recording medium insertion portion, and the like. Although they may be provided on the same surface as the display portion, it is preferable to provide them on the side surface or the back surface for the design of the digital photo frame 9700. For example, a memory storing data of an image shot by a digital camera is inserted in the recording medium insertion portion of the digital photo frame, whereby the image data can be transferred and displayed on the display portion 9703.

The digital photo frame 9700 may have a configuration capable of wirelessly transmitting and receiving data. Through wireless communication, desired image data can be transferred to be displayed.

Figure 24A:
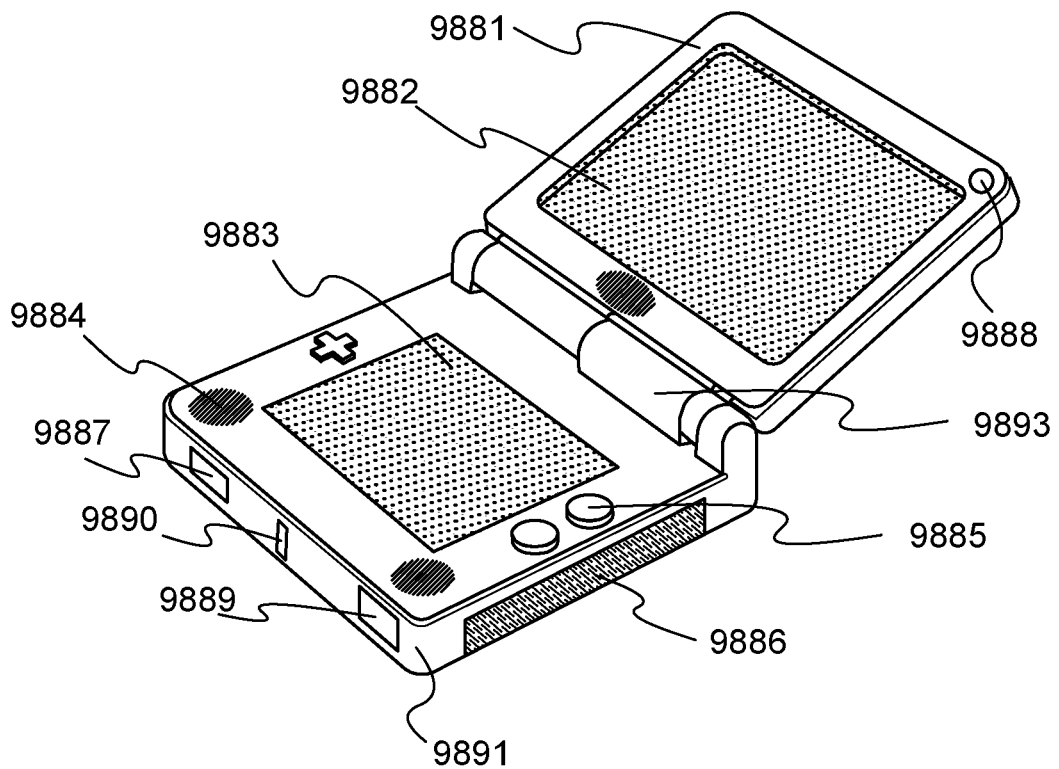
FIGS. 24A and 24B are external views illustrating examples of game machines.

FIG. 24A illustrates a portable amusement machine including two housings: a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively. In addition, the portable amusement machine illustrated in FIG. 24A includes a speaker portion 9884, a recording medium insertion portion 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. It is needless to say that the structure of the portable amusement machine is not limited to the above and other structures provided with at least a semiconductor device disclosed in this specification can be employed. The portable amusement machine may include other accessory equipment as appropriate. The portable amusement machine illustrated in FIG. 24A has a function of reading a program or data stored in a recording medium to display it on the display portion, and a function of sharing information with another portable amusement machine by wireless communication. The portable amusement machine illustrated in FIG. 24A can have various functions without limitation to the above.

Figure 24B:
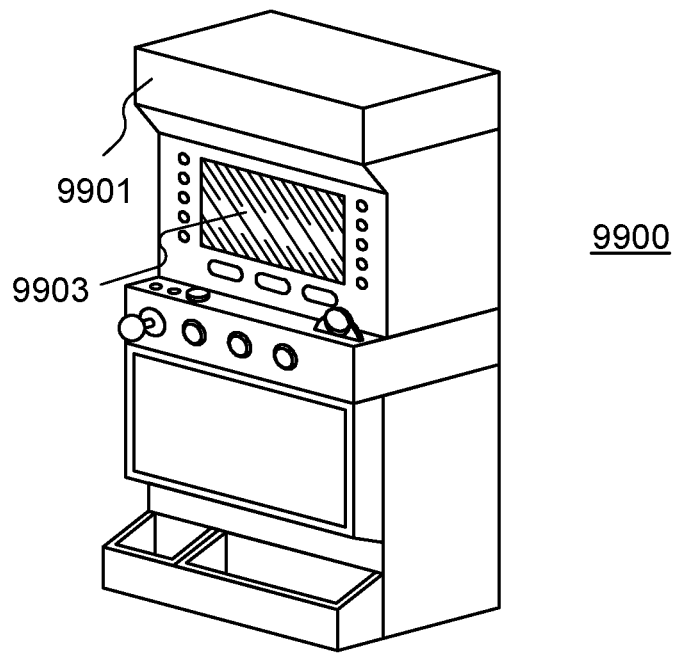

FIG. 24B illustrates an example of a slot machine 9900 which is a large-sized amusement machine. In the slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a semiconductor device disclosed in this specification may be employed. The slot machine 9900 may include other accessory equipment as appropriate.

Figure 25A:
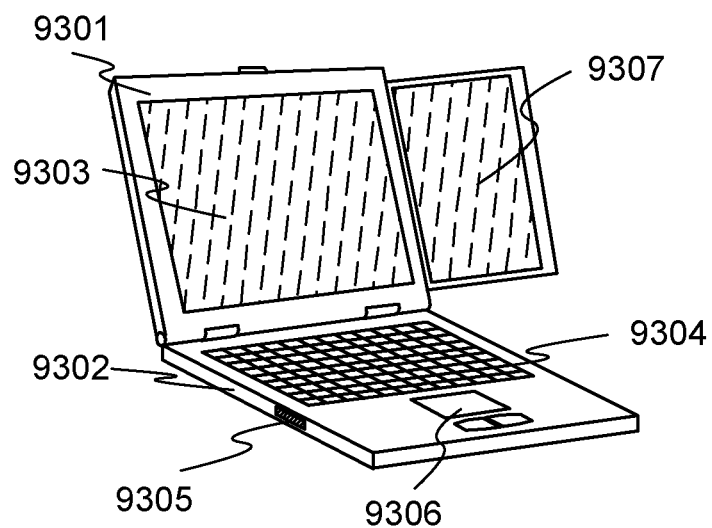
FIG. 25A is an external view illustrating an example of a computer and FIG. 25B is an external view illustrating an example of a mobile phone.

FIG. 25A is a perspective view illustrating an example of a portable computer.

In the portable computer of FIG. 25A, a top housing 9301 having a display portion 9303 and a bottom housing 9302 having a keyboard 9304 can overlap with each other by closing a hinge unit which connects the top housing 9301 and the bottom housing 9302. The portable computer of FIG. 25A can be convenient for carrying, and in the case of using the keyboard for input, the hinge unit is opened and the user can input looking at the display portion 9303.

The bottom housing 9302 includes a pointing device 9306 with which input can be performed, in addition to the keyboard 9304. Further, when the display portion 9303 is a touch input panel, input can be performed by touching part of the display portion. The bottom housing 9302 includes an arithmetic function portion such as a CPU or hard disk. In addition, the bottom housing 9302 includes another device, for example, an external connection port 9305 into which a communication cable conformable to communication standards of a USB is inserted.

The top housing 9301, which includes a display portion 9307 and can keep the display portion 9307 therein by sliding it toward the inside of the top housing 9301, can have a large display screen. In addition, the user can adjust the orientation of a screen of the display portion 9307 which can be kept in the top housing 9301. When the display portion 9307 which can be kept in the top housing 9301 is a touch input panel, input can be performed by touching part of the display portion 9307 which can be kept in the top housing 9301.

The display portion 9303 or the display portion 9307 which can be kept in the top housing 9301 is formed using an image display device of a liquid crystal display panel, a light-emitting display panel such as an organic light-emitting element or an inorganic light-emitting element, or the like.

In addition, the portable computer of FIG. 25A can be provided with a receiver and the like and can receive a television broadcast to display an image on the display portion. The user can watch a television broadcast when the whole screen of the display portion 9307 is exposed by sliding the display portion 9307 while the hinge unit which connects the top housing 9301 and the bottom housing 9302 is kept closed. In this case, the hinge unit is not opened and display is not performed on the display portion 9303. In addition, start up of only a circuit for displaying a television broadcast is performed. Therefore, power can be consumed to the minimum, which is useful for the portable computer whose battery capacity is limited.

Figure 25B:
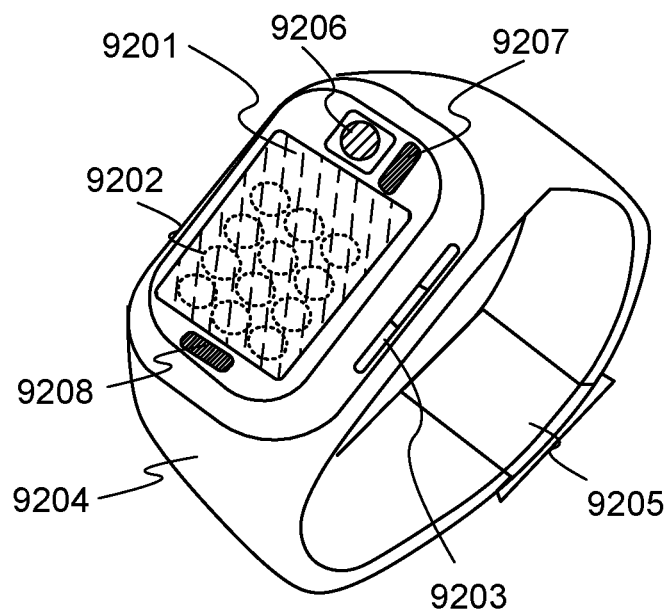

FIG. 25B is a perspective view illustrating an example of a cellular phone that the user can wear on the wrist like a wristwatch.

This cellular phone is formed with a main body which includes a communication device including at least a telephone function, and battery; a band portion which enables the main body to be wore on the wrist; an adjusting portion 9205 for adjusting the fixation of the band portion fixed for the wrist; a display portion 9201; a speaker 9207; and a microphone 9208.

In addition, the main body includes operation switches 9203. The operation switches 9203 can serve, for example, as a switch for starting a program for the Internet when pushed, in addition to serving as a power switch, a switch for shifting the display, a switch for instruction to start taking images, or the like, and can be configured to have respective functions.

Input to this cellular phone is operated by touching the display portion 9201 with a finger or an input pen, operating the operation switches 9203, or inputting voice into the microphone 9208. Note that displayed buttons 9202 which are displayed on the display portion 9201 are illustrated in FIG. 25B. Input can be performed by touching the displayed buttons 9202 with a finger or the like.

Further, the main body includes a camera portion 9206 including an image pick-up means having a function of converting an image of an object, which is formed through a camera lens, to an electronic image signal. Note that the camera portion is not necessarily provided.

The cellular phone illustrated in FIG. 25B is provided with a receiver of a television broadcast and the like, and can display an image on the display portion 9201 by receiving a television broadcast. In addition, the cellular phone illustrated in FIG. 25B is provided with a memory device and the like such as a memory, and can record a television broadcast in the memory. The cellular phone illustrated in FIG. 25B may have a function of collecting location information such as GPS.

An image display device of a liquid crystal display panel, a light-emitting display panel such as an organic light-emitting element or an inorganic light-emitting element, or the like is used as the display portion 9201. The cellular phone illustrated in FIG. 25B is compact and lightweight and the battery capacity of the cellular phone illustrated in FIG. 25B is limited. Therefore, a panel which can be driven with low power consumption is preferably used as a display device for the display portion 9201.

Note that FIG. 25B illustrates the electronic apparatus which is worn on the wrist; however, this embodiment is not limited thereto as long as a portable shape is employed.

Example 1

In this example, a thin film transistor of one embodiment of the present invention is manufactured and the results of the electric characteristic evaluation are shown.

In this example, four thin film transistors (A, B, C, and D) are formed in different steps from one another. Manufacturing methods of the thin film transistors are described. A silicon oxynitride film with a thickness of 100 nm is formed as a base film over a glass substrate by a CVD method. Then, a tungsten film with a thickness of 150 nm is formed as a gate electrode layer over the silicon oxynitride film by a sputtering method. A silicon oxynitride film with a thickness of 200 nm is formed as a gate insulating layer over the gate electrode layer by a CVD method.

A semiconductor layer is formed over the gate insulating layer using an In—Ga—Zn—O based oxide semiconductor target ($In_2O_3$:$Ga_2O_3$:ZnO=1:1:1) under an atmosphere containing argon and oxygen (argon:oxygen=30 sccm:15 sccm) under the following conditions: the distance between the substrate and the target is 60 mm, the pressure is 0.4 Pa, and the direct current (DC) power supply is 0.5 kW.

As source and drain electrode layers, a titanium film (thickness of 50 nm), an aluminum film (thickness of 200 nm), and a titanium film (thickness of 50 nm) are stacked over the semiconductor layer by a sputtering method.

Next, as the transistors A and B, the semiconductor layer is heated at 350° C. under an air atmosphere for one hour, and as the transistors C and D, the semiconductor layer is heated at 350° C. under a nitrogen atmosphere for one hour. This heat treatment is a first heat treatment.

In each of the thin film transistors A, B, C, and D, a silicon oxide film with a thickness of 300 nm is formed as an insulating film by a sputtering method so as to be in contact with the semiconductor layer. In addition, a titanium film (thickness of 50 nm), an aluminum film (thickness of 200 nm), and a titanium film (thickness of 50 nm) are stacked as wiring layers over the insulating film by a sputtering method.

Then, the thin film transistors A and C are heated at 250° C. under an air atmosphere for one hour, and as the thin film transistors B and D, the semiconductor layer is heated at 250° C. under a nitrogen atmosphere for one hour. This heat treatment is a second heat treatment.

Through the above steps, four thin film transistors are manufactured: the thin film transistor A on which the first heat treatment is performed at 350° C. under an air atmosphere for one hour and the second heat treatment is performed at 250° C. under an air atmosphere for one hour; the thin film transistor B on which the first heat treatment is performed at 350° C. under an air atmosphere for one hour and the second heat treatment is performed at 250° C. under a nitrogen atmosphere for one hour; the thin film transistor C on which the first heat treatment is performed at 350° C. under a nitrogen atmosphere for one hour and the second heat treatment is performed at 250° C. under an air atmosphere for one hour; and the thin film transistor D on which the first heat treatment is performed at 350° C. under a nitrogen atmosphere for one hour and the second heat treatment is performed at 250° C. under a nitrogen atmosphere for one hour. The semiconductor layer included in each of the thin film transistors A, B, C, and D has a channel length (L) of 20 μm and a channel width (W) of 20 μm.

A BT stress test (bias·temperature stress test) is conducted on each of the thin film transistors A, B, C, and D to evaluate electric characteristics. Measurement conditions of the BT stress teat are as follows: temperature is at 150° C.; measurement time is one hour; gate voltage (Vg) is +20 V, and drain voltage (Vd) is 1 V or 10V.

Figure 26A:
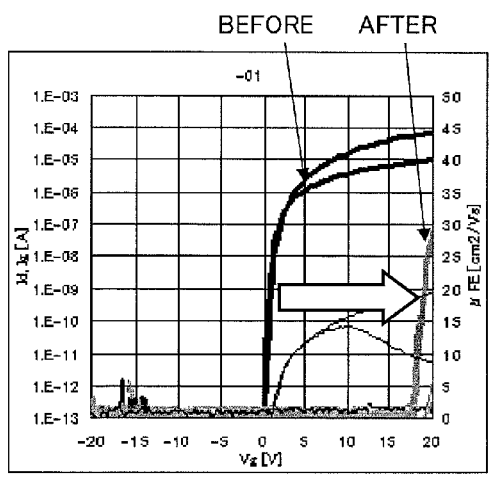
FIGS. 26A to 26D are graphs showing evaluation results of electric characteristics of the thin film transistors.
Figure 26B:
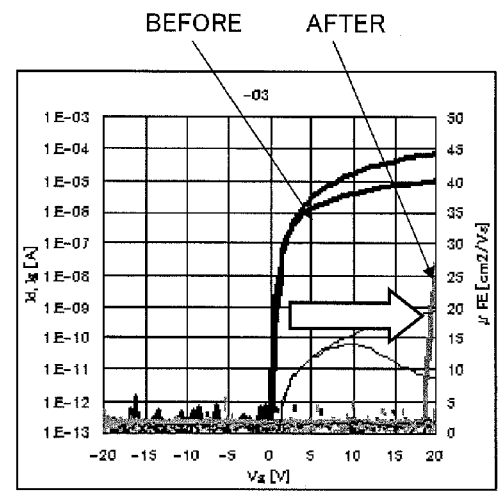
Figure 26C:
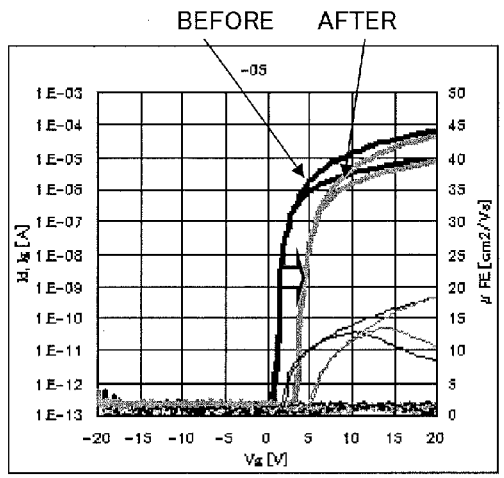
Figure 26D:
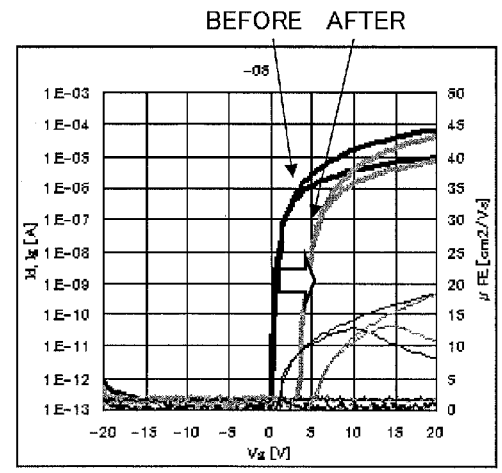
Figure 27A:
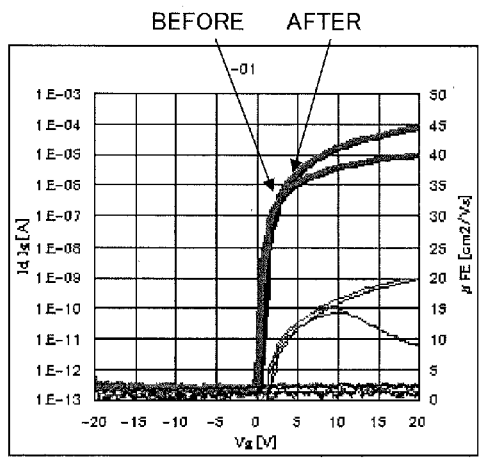
FIGS. 27A to 27D are graphs showing evaluation results of electric characteristics of the thin film transistors.
Figure 27B:
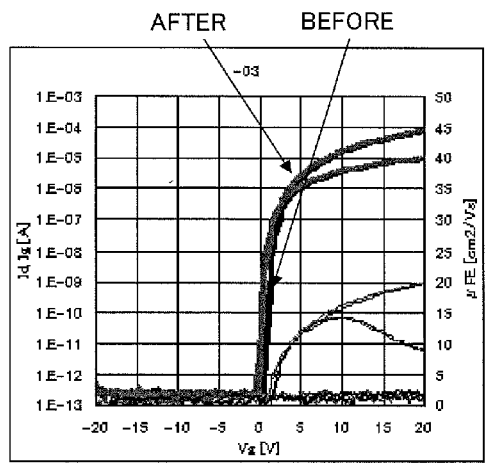
Figure 27C:
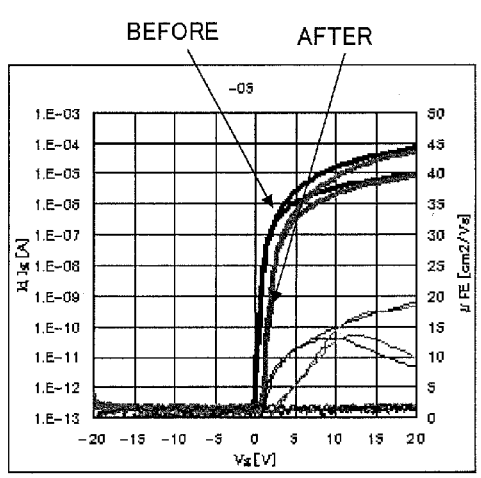
Figure 27D:
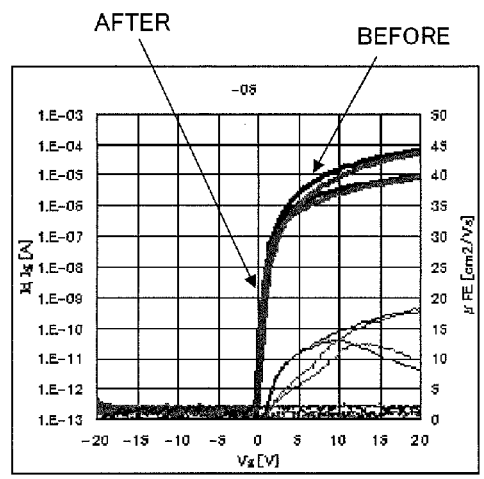
Figure 28A:
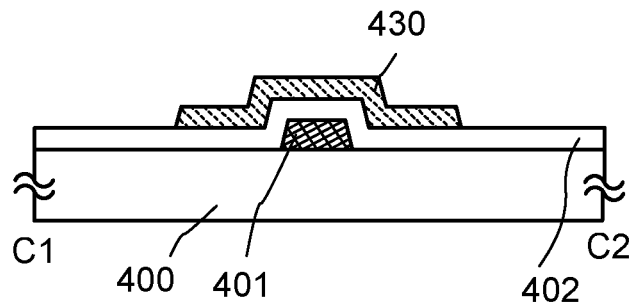
FIGS. 28A to 28D illustrate a method for manufacturing a semiconductor device.
Figure 28B:
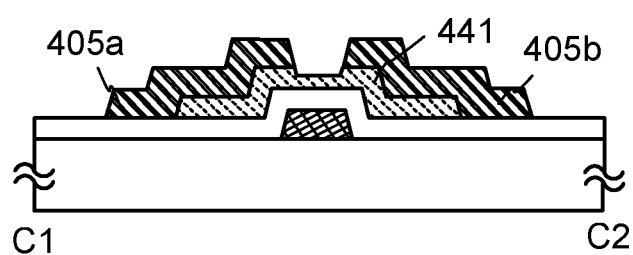
Figure 28C:
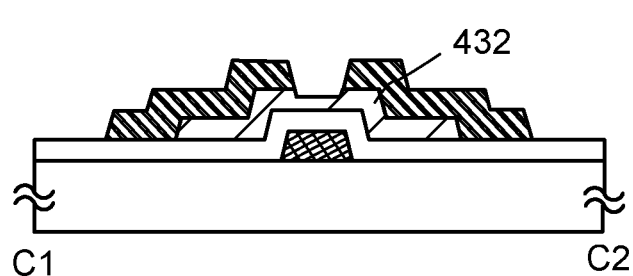
Figure 28D:
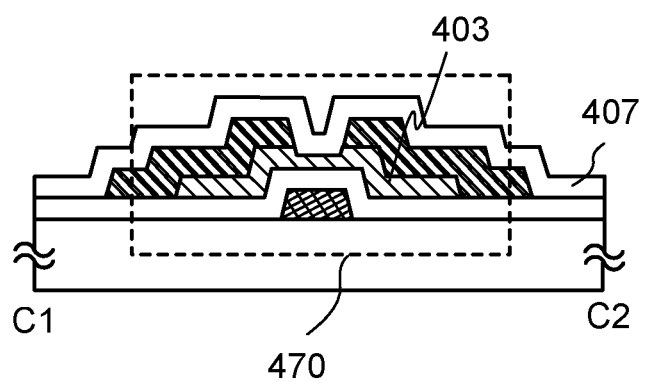

FIGS. 26A to 26D are results of the positive gate BT stress test, and FIGS. 27A to 27D are results of the negative gate BT stress test (Vg–Id (gate voltage–drain current), Vg–Ig (gate voltage–gate current), Vg–μFE (gate voltage–mobility)). FIG. 26A and FIG. 27A are evaluation results of the thin film transistor A. FIG. 26B and FIG. 27B are evaluation results of the thin film transistor B. FIG. 26C and FIG. 27C are evaluation results of the thin film transistor C. FIG. 26D and FIG. 27D are evaluation results of the thin film transistor D. Note that an arrow in each of FIGS. 26A to 26D indicates an amount of shift of Vg–Id (gate voltage–drain current) curves after the test.

As shown in FIGS. 27A to 27D, shift (movement) of the threshold voltage is hardly observed in each of the thin film transistors A to D in the negative gate BT stress test.

On the contrary, as shown in FIGS. 26A to 26D, the threshold voltages of the thin film transistor A (FIG. 26A) and the thin film transistor B (FIG. 26B), on which the first heat treatment is performed under an air atmosphere, are largely shifted by +15 V or more in the positive gate BT stress test, as compared before and after the positive gate BT stress test. On the other hand, the threshold voltages of

What is claimed is:

1. A method for manufacturing a semiconductor device, comprising:

forming a gate electrode layer over a substrate having an insulating surface;

forming a gate insulating layer over the gate electrode layer;

forming an oxide semiconductor layer over the gate insulating layer;

heating the oxide semiconductor layer under a nitrogen atmosphere;

forming a source electrode layer and a drain electrode layer over the oxide semiconductor layer after the heating step; and forming an insulating film comprising silicon and oxygen over the gate insulating layer, the oxide semiconductor layer, the source electrode layer, and the drain electrode layer so that the insulating film comprising silicon and oxygen is in contact with part of the oxide semiconductor layer.

2. A method for manufacturing a semiconductor device, comprising:
    forming a gate electrode layer over a substrate having an insulating surface;
    forming a gate insulating layer over the gate electrode layer;
    forming an oxide semiconductor layer over the gate insulating layer;
    forming a source electrode layer and a drain electrode layer over the oxide semiconductor layer;
    heating the oxide semiconductor layer, the source electrode layer, and the drain electrode layer under a nitrogen atmosphere; and
    forming an insulating film comprising silicon and oxygen over the gate insulating layer, the oxide semiconductor layer, the source electrode layer, and the drain electrode layer after the heating step so that the insulating film comprising silicon and oxygen is in contact with part of the oxide semiconductor layer.

3. A method for manufacturing a semiconductor device, comprising:
    forming a gate electrode layer over a substrate having an insulating surface;
    forming a gate insulating layer over the gate electrode layer;
    forming a source electrode layer and a drain electrode layer over the gate insulating layer;
    forming an oxide semiconductor layer over the source electrode layer and the drain electrode layer;
    heating the oxide semiconductor layer under a nitrogen atmosphere; and
    forming an insulating film comprising silicon and oxygen over the gate insulating layer, the source electrode layer, the drain electrode layer, and the oxide semiconductor layer after the heating step so that the insulating film comprising silicon and oxygen is in contact with the oxide semiconductor layer.

4. The method for manufacturing a semiconductor device according to claim 1 or 2, wherein the heating step is performed at 200° C. or higher under the nitrogen atmosphere.

5. The method for manufacturing a semiconductor device according to claim 1 or 2, wherein the oxide semiconductor layer is formed by a sputtering method under an oxygen atmosphere, an argon atmosphere, or an atmosphere containing oxygen and argon.

6. A method for manufacturing a semiconductor device, comprising:
    forming a gate electrode layer over a substrate having an insulating surface;
    forming a gate insulating layer over the gate electrode layer;
    forming a first oxide semiconductor layer over the gate insulating layer;
    heating the first oxide semiconductor layer under a nitrogen atmosphere to reduce its resistance, so that a second oxide semiconductor layer is formed;
    forming a conductive film over the second oxide semiconductor layer;
    selectively etching the conductive film to expose part of the second oxide semiconductor layer overlapped with the gate electrode layer, and to form a source electrode layer and a drain electrode layer; and
    forming an insulating film comprising silicon and oxygen over the gate insulating layer, the second oxide semiconductor layer, the source electrode layer, and the drain electrode layer,
    wherein the second oxide semiconductor layer includes a first region and a second region, the first region being in contact with the insulating film comprising silicon and oxygen, the second region being in contact with one of the source electrode layer and the drain electrode layer, and
    wherein the first region has a higher resistance than the second region.

7. A method for manufacturing a semiconductor device, comprising:
    forming a gate electrode layer over a substrate having an insulating surface;
    forming a gate insulating layer over the gate electrode layer;
    forming a conductive film over the gate insulating layer;
    selectively etching the conductive film to form a source electrode layer and a drain electrode layer;
    forming a first oxide semiconductor layer over the source electrode layer and the drain electrode layer;
    heating the first oxide semiconductor layer under a nitrogen atmosphere to reduce its resistance, so that a second oxide semiconductor layer is formed; and
    forming an insulating film comprising silicon and oxygen over the gate insulating layer, the source electrode layer, the drain electrode layer and the second oxide semiconductor layer,
    wherein the second oxide semiconductor layer includes a first region and a second region, the first region being in contact with the insulating film comprising silicon and oxygen, the second region being in contact with one of the source electrode layer and the drain electrode layer, and
    wherein the first region has a higher resistance than the second region.

8. The method for manufacturing a semiconductor device according to claim 6, wherein the heating step is performed at 200° C. or higher under the nitrogen atmosphere.

9. The method for manufacturing a semiconductor device according to claim 6, wherein the first oxide semiconductor layer is formed by a sputtering method under an oxygen atmosphere, an argon atmosphere, or an atmosphere containing oxygen and argon.

10. The method for manufacturing a semiconductor device according to claim 1, 2, or 6, wherein the insulating film comprising silicon and oxygen is formed under an oxygen atmosphere, an argon atmosphere, or an atmosphere containing oxygen and argon.

11. The method for manufacturing a semiconductor device according to claim 1, 2, or 6, further comprising a step of heating after the insulating film comprising silicon and oxygen is formed.

12. The method for manufacturing a semiconductor device according to claim 1, 2, or 6, wherein the semiconductor device is incorporated in one selected from the group consisting of a poster, an advertisement, an electronic book, a television set, a digital photo frame, an amusement machine, a computer, a wristwatch, and a mobile phone.

13. The method for manufacturing a semiconductor device according to claim 1 or 2, wherein an electrical conductivity of the oxide semiconductor layer is increased by the heating step to $1\times10^{-1}$ S/cm or higher.

14. The method for manufacturing a semiconductor device according to claim 6, wherein an electrical conductivity of the second oxide semiconductor layer is increased by the heating step to $1\times10^{-1}$ S/cm or higher.

15. The method for manufacturing a semiconductor device according to claim 1 or 2, wherein the oxide semiconductor layer comprises In, Ga and Zn.

16. The method for manufacturing a semiconductor device according to claim 6, wherein the first oxide semiconductor layer comprises In, Ga and Zn.

17. The method for manufacturing a semiconductor device according to claim 1, 2, or 6, wherein the insulating film comprising silicon and oxygen is formed by a sputtering method.

18. The method for manufacturing a semiconductor device according to claim 1, 2, or 6, wherein the insulating film comprising silicon and oxygen is a silicon oxide film.

19. A method for manufacturing a semiconductor device, comprising:
   forming a gate electrode layer over a substrate having an insulating surface;
   forming a gate insulating layer over the gate electrode layer;
   forming a first oxide semiconductor layer over the gate insulating layer;
   first heating the first oxide semiconductor layer to reduce a resistance of the first oxide semiconductor layer, so that a second oxide semiconductor layer is formed;
   forming a first insulating film comprising silicon and oxygen over the gate insulating layer and the second oxide semiconductor layer, so that the first insulating film is in contact with part of the second oxide semiconductor layer;
   second heating the first insulating film; and
   forming a second insulating film comprising silicon nitride over the first insulating film.

20. The method for manufacturing a semiconductor device according to claim 19, wherein the first heating step is performed at 200° C. or higher.

21. The method for manufacturing a semiconductor device according to claim 19, wherein the second heating step is performed at 300° C. or lower.

22. The method for manufacturing a semiconductor device according to claim 19, wherein the first oxide semiconductor layer comprises In, Ga and Zn.

23. The method for manufacturing a semiconductor device according to claim 19, wherein the first insulating film is formed by a sputtering method.

24. The method for manufacturing a semiconductor device according to claim 19, wherein the first insulating film is a silicon oxide film.

* * * * *

UNITED STATES PATENT AND TRADEMARK OFFICE
CERTIFICATE OF CORRECTION

PATENT NO. : 8,796,078 B2
APPLICATION NO. : 12/787757
DATED : August 5, 2014
INVENTOR(S) : Toshinari Sasaki et al.

It is certified that error appears in the above-identified patent and that said Letters Patent is hereby corrected as shown below:

In the Specification,

At column 1, line 9, "thereof" should be --thereof.--;

At column 1, line 63, "$Ga_2O_3(ZnO)$." should be --$Ga_2O_3(ZnO)_m$--;

At column 17, line 50, "the conductive" should be --the transparent conductive--;

At column 18, line 2, "of electrode" should be --of the electrode--;

At column 36, line 50, "4504b" should be --4504b,--;

After column 42, line 45, immediately following "the threshold voltages of," please add:

"the thin film transistor C (FIG. 26C) and the thin film transistor D (FIG. 26D), on which the first heat treatment is performed under a nitrogen atmosphere, are hardly shifted as compared before and after the positive gate BT stress test; the amount of shift is +5 V or less. Accordingly, it is confirmed that the thin film transistors C and D, on which the first heat treatment is performed under a nitrogen atmosphere, have stable electric characteristics.

Thus, as the invention disclosed in this specification, after formation of a semiconductor layer, a thin film transistor is formed in a manner in which a first heat treatment is performed under a nitrogen atmosphere before formation of an insulating film, whereby the thin film transistor can have stable electric characteristics, and thus a semiconductor device including the thin film transistor can have high reliability.

This application is based on Japanese Patent Application serial no. 2009-131187 filed with Japan Patent Office on May 29, 2009, the entire contents of which are hereby incorporated by reference."

Signed and Sealed this
Tenth Day of February, 2015

Michelle K. Lee
*Deputy Director of the United States Patent and Trademark Office*